United States Patent
Ahn et al.

(10) Patent No.: US 11,275,408 B2
(45) Date of Patent: Mar. 15, 2022

(54) STRETCHABLE DISPLAY PANEL AND STRETCHABLE DISPLAY DEVICE INCLUDING THE SAME

(71) Applicant: LG Display Co., Ltd., Seoul (KR)

(72) Inventors: JiYoung Ahn, Goyang-si (KR); Seulki Kim, Seosan-si (KR)

(73) Assignee: LG Display Co., Ltd., Seoul (KR)

( * ) Notice: Subject to any disclaimer, the term of this patent is extended or adjusted under 35 U.S.C. 154(b) by 77 days.

(21) Appl. No.: 16/709,776

(22) Filed: Dec. 10, 2019

(65) Prior Publication Data

US 2020/0201393 A1 Jun. 25, 2020

(30) Foreign Application Priority Data

Dec. 21, 2018 (KR) ........................ 10-2018-0167826

(51) Int. Cl.
*G06F 1/00* (2006.01)
*G06F 1/16* (2006.01)
*G09F 9/30* (2006.01)

(52) U.S. Cl.
CPC .......... *G06F 1/1652* (2013.01); *G06F 1/1626* (2013.01); *G09F 9/301* (2013.01); *H01L 2251/5338* (2013.01)

(58) Field of Classification Search
CPC .... H01L 24/50; H05K 1/0277; H05K 1/0278; H05K 1/028; H05K 1/0281; H05K 1/0283; H05K 1/0393; H05K 1/118; H05K 1/147; H05K 1/148; H05K 1/189; H05K 2201/042; H05K 2201/046; H05K 2201/05
See application file for complete search history.

(56) References Cited

U.S. PATENT DOCUMENTS

| | | | |
|---|---|---|---|
| 8,198,621 B2* | 6/2012 | Rogers | H01L 23/5387 257/9 |
| 9,841,548 B2 | 12/2017 | Kim et al. | |
| 9,869,807 B2 | 1/2018 | Kim et al. | |
| 2002/0094701 A1* | 7/2002 | Biegelsen | H01L 25/0655 439/32 |
| 2009/0317639 A1* | 12/2009 | Axisa | H05K 1/0283 428/411.1 |
| 2014/0218872 A1* | 8/2014 | Park | H05K 1/0283 361/749 |
| 2014/0299362 A1* | 10/2014 | Park | H05K 1/0283 174/254 |
| 2014/0340857 A1* | 11/2014 | Hsu | A61B 5/6846 361/749 |
| 2017/0003440 A1 | 1/2017 | Kim et al. | |
| 2017/0005077 A1 | 1/2017 | Kim et al. | |
| 2020/0267835 A1* | 8/2020 | Okimoto | H05K 3/4644 |

FOREIGN PATENT DOCUMENTS

KR 10-2018-0011812 A 2/2018

* cited by examiner

*Primary Examiner* — Pete T Lee
(74) *Attorney, Agent, or Firm* — Fenwick & West LLP

(57) ABSTRACT

A display device includes a lower substrate that includes a first substrate, and a plurality of second substrates on the first substrate. The plurality of second substrates have higher rigidity than a rigidity of the first substrate. The plurality of second substrates may be spaced apart from each other. The lower substrate also includes one or more light emitting elements disposed on each of the plurality of second substrates.

21 Claims, 15 Drawing Sheets

STRETCHABLE DISPLAY PANEL AND STRETCHABLE DISPLAY DEVICE INCLUDING THE SAME

CROSS-REFERENCE TO RELATED APPLICATIONS

This application claims the priority of Republic of Korea Patent Application No. 10-2018-0167826 filed on Dec. 21, 2018, in the Korean Intellectual Property Office, the disclosure of which is incorporated herein by reference in its entirety.

BACKGROUND

Field

The present disclosure relates to a stretchable display device and, more particularly, to a stretchable display device including a pattern that suppresses overstretching.

Description of the Related Art

An Organic Light Emitting Display (OLED) that generates light by itself, a Liquid Crystal Display (LCD) that requires separate light sources, etc. are used as the display devices used in a computer monitor, a TV, and a mobile phone.

Display devices are being applied to more and more various fields including not only a computer monitor and a TV, but personal mobile devices, and a display device having a wide display area and reduced volume and weight is being studied.

Recently, a stretchable display device manufactured to be able to stretch or contract in a specific direction and change into various shapes by forming a display unit, lines, etc. on a flexible substrate such as plastic that is a flexible material has been spotlighted as a next generation display device.

SUMMARY

Embodiments relate to a display device including a lower substrate. The lower substrate includes a first substrate, and a plurality of second substrates on the first substrate, the plurality of second substrates having higher rigidity than a rigidity of the first substrate. The plurality of second substrates may be spaced apart from each other. The lower substrate also includes one or more light emitting elements disposed on each of the plurality of second substrates.

In one embodiment, an elastic modulus of the plurality of second substrates may be higher than an elastic modulus of the first substrate.

In one embodiment, the first substrate may be made from at least one of polydimethylsiloxane (PDMS), or polyurethane (PU).

In one embodiment, the plurality of second substrates may be made from at least one of polyimide (PI), polyacrylate, or polyacetate.

In one embodiment, the display device further includes a first connecting line on the lower substrate. The first connecting line may extend between a pair of second substrates arranged along a first direction.

In one embodiment, the display device further includes a second connecting line on the lower substrate. The second connecting line may extend between another pair of second substrates arranged along a second direction intersecting the first direction.

In one embodiment, the first connecting line may be at least one of a gate line driven by a gate driving circuit, a data line driving by a data driving circuit, a high-potential power line, or a reference voltage line of the display device.

In one embodiment, the first connecting line may include a first part extending in the first direction, and a second part extending along a side surface of a second substrate that adjoins the first part.

In one embodiment, the display device includes a reinforcing member on a portion of the first connecting line adjoining the first part and the second part.

In one embodiment, the display device includes a pad on a second substrate of the pair of second substrates, another pad on the remaining second substrate of the pair of second substrates, and the first connecting line may extend along a side surface of the second substrate to contact the pad, and may also extend along a side surface of the other second substrate to contact the another pad.

In one embodiment, the first connecting line may be made of a base polymer including conductive particles.

In one embodiment, the display device includes one or more suppression patterns on the first substrate. The one or more suppression patterns may be disposed in spaces between the plurality of second substrates.

In one embodiment, the one or more suppression patterns have higher rigidity than the rigidity of the first substrate.

In one embodiment, a suppression pattern in the one or more suppression patterns may include a first rigid portion and a second rigid portion on the first rigid portion. The second portion may have higher rigidity than a rigidity of the first rigid portion.

In one embodiment, the one or more suppression patterns may have a curvy shape.

In one embodiment, the plurality of second substrates includes a row of second substrates arranged along a first direction, a column of second substrates arranged along a second direction intersecting the first direction. The one or more suppression patterns may extend along a third direction between the first direction and the second direction.

In one embodiment, the display device includes a connecting line on the lower substrate, the connecting line extending between a pair of second substrates, and the one or more suppression patterns may include a plurality of suppression patterns disposed along the connecting line.

In one embodiment, the display device includes one or more transistors on each of the plurality of second substrates.

In one embodiment, the display device includes a plurality of insulating layers each disposed on or below the one or more light emitting elements of a corresponding second substrate. The plurality of insulating layers may be spaced apart from each other.

In one embodiment, an insulating layer in the plurality of insulating layers may not contact the first substrate.

It is to be understood that both the foregoing general description and the following detailed description are examples and are explanatory and are intended to provide further explanation of the invention as claimed.

BRIEF DESCRIPTION OF THE DRAWINGS

The above and other aspects, features and other advantages of the present disclosure will be more clearly understood from the following detailed description taken in conjunction with the accompanying drawings.

DETAILED DESCRIPTION OF THE EMBODIMENT

Figure 1:
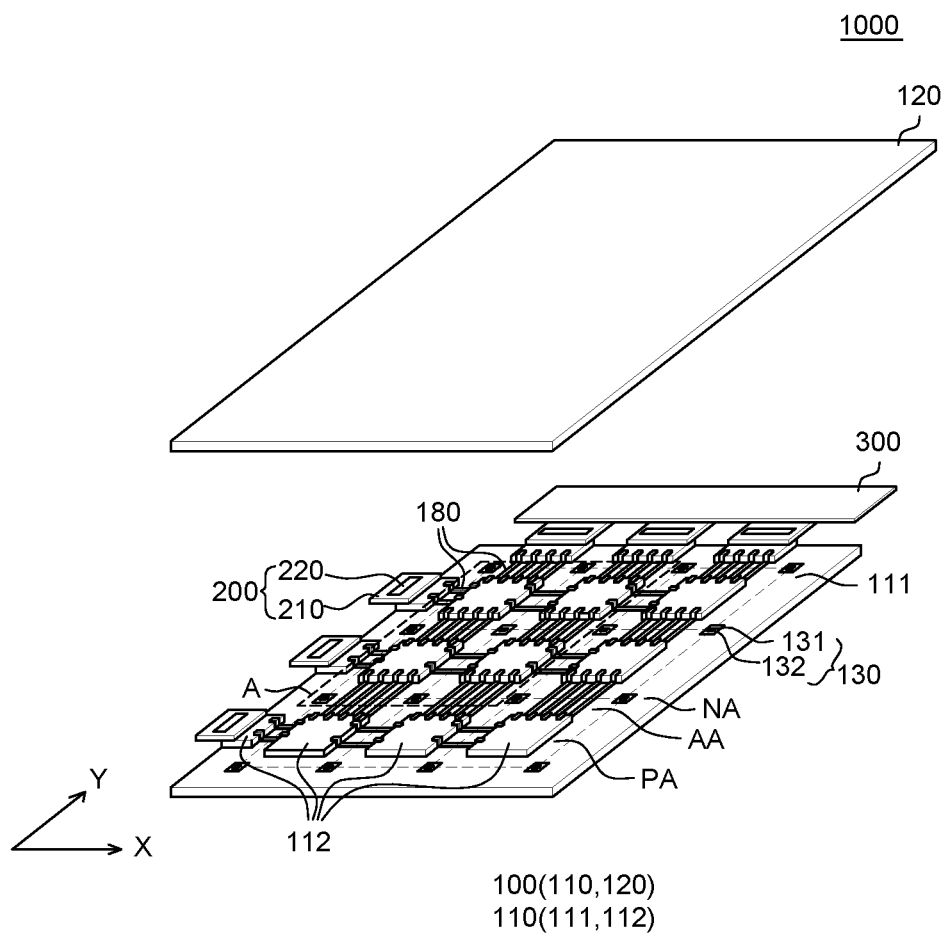
FIG. 1 is an exploded perspective view of a stretchable display device according to an embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a strechable display device according to exemplary embodiments of the present disclosure will be described in detail with reference to accompanying drawings.

A stretchable display device can be referred to as a display device that can display images even if it is bent or stretched. A stretchable display device can have high flexibility, as compared with common display devices. Accordingly, the shape of the stretchable display device can be freely changed in accordance with operation by the user such as bending or stretching the stretchable display device. For example, when a user holds and pulls an end of a stretchable display device, the stretchable display device can be stretched by the force of the user. Alternatively, when a user puts a stretchable display device on an uneven wall, the stretchable display device can be disposed to be bent in the surface shape of the wall. Further, when the force applied by a user is removed, a stretchable display device can return into the initial shape.

FIG. 1 is an exploded perspective view of a stretchable display device according to an embodiment of the present disclosure. Referring to FIG. 1, a stretchable display device 1000 according to an embodiment of the present disclosure includes a display panel 100, a flexible connecting film 200, and a printed circuit board 300.

The display panel 100 can stretch and contract in any one direction of a first direction X and a second direction Y or can 2-dimensionally stretch and contract in the first direction X and the second direction Y. Here, the first direction X and the second direction Y define the plane of the stretchable display device 1000 and the second direction Y may be a direction intersecting with the first direction X, for example, the second direction Y may be perpendicular to the first direction X.

The display panel 100 includes a lower substrate 110 disposed at a lower portion and an upper substrate 120 disposed on the lower substrate 110. Though not shown in FIG. 1, the display panel 100 may further include a polarizing layer that may be disposed on the upper substrate 120 or under the lower substrate 110. Further, the lower substrate 110 and the upper substrate 120 of the display panel 100, though not shown, may be bonded by an adhesive layer.

The lower substrate 110 is a substrate for supporting and protecting various components of the stretchable display device 1000. The lower substrate 110 may include a first substrate 111 that is a base substrate made of a bendable or stretchable soft material and a second substrate 112 of the lower substrate 110 disposed on the first substrate 111 of the lower substrate 110 and made of a material that is more rigid than the first substrate 111. In other words, the rigidity of the plurality of second substrates 112 may be higher than a rigidity of the first substrate 111.

A stretchable display device needs an easily bending or stretching characteristic, so there have been attempts to use substrates that have a flexible property due to a small modulus. However, when a soft material such as polydimethylsiloxane (PDMS) having a small modulus is used as the material of a lower substrate on which emitting elements are disposed, a material having a small modulus is weak to heat, so, due to this characteristic, there is a problem that the substrate is damaged by high temperature, for example, temperature over 100° C. that is generated in the process of forming transistors and the emitting elements.

Accordingly, emitting elements should be formed on a substrate made of a material that can withstand high temperature, so damage to the substrate can be suppressed in the process of manufacturing the emitting elements. Accordingly, there have been attempts to manufacture a substrate using materials that can withstand high temperature, which is generated in the manufacturing process, such as polyimide (PI). However, the materials that can withstand high temperature do not have flexible properties due to large moduli, so substrates are not easily bent or stretched when the stretchable display devices are stretched.

Accordingly, in the stretchable display device 1000 according to an embodiment of the present disclosure, a plurality of second substrates 112 that is rigid substrates is disposed in areas where transistors or emitting elements, etc. are disposed on the base substrate made of a soft material, thereby being able to have a stretching characteristic while suppressing damage to substrates due to high temperature in the manufacturing process of the transistors or emitting elements.

Further, in the stretchable display device 1000 according to an embodiment of the present disclosure, the first substrate 111 made of a soft material that is a base substrate is disposed under the plurality of second substrate 112, and the upper substrate 120 made of a soft material is disposed over the plurality of second substrate 112. At this time, the first substrate 111 and the upper substrate 120 may be made of the same soft material. The soft material may refer to materials that have a bendable, flexible, or stretchable characteristic. Accordingly, the first substrate 111 and the upper substrate 120 except the areas overlapping with the plurality of second substrates 112 disposed in an individual type on the lower substrate 110 can be easily stretched or bent, so the stretchable display device 1000 can be easily achieved. Further, by disposing transistors, emitting elements, etc. on the plurality of second substrates 112 made of a rigid material in comparison to the first substrate 111 and the upper substrate 120, damage can be suppressed although the stretchable display device 1000 is bent or stretched.

The first substrate 111 may be made of an insulating material that can bend or stretch. For example, the first substrate 111 may be made of silicon rubber such as polydimethylsiloxane (PDMS) or an elastomer such as polyurethane (PU), so it may have flexibility. The material of the first substrate 111, however, is not limited thereto. The first substrate 111, which is a flexible substrate, may reversibly expand and contract. Further, an elastic modulus may be several to hundreds of MPa and a tensile fracture rate may be 100% or more. The thickness of the first substrate 111 may be 10 μm to 1 mm, but is not limited thereto.

The plurality of second substrates 112 spaced and disposed apart from each other in an individual type is disposed on the first substrate 111. The plurality of second substrates 112 may be substrates that are more rigid than the first substrate 111, but is flexible substrates with less elasticity. The plurality of second substrates 112, which may be referred to as so-called individual substrates, for example, may be made of polyimide (PI), polyacrylate, polyacetate, etc. The plurality of second substrates 112 may be arranged as rows along a first direction X, and as columns along a second direction Y intersecting the first direction X.

The modulus of the plurality of second substrates 112 may be higher than that of the first substrate 111. The modulus is an elastic modulus showing the ratio of deformation of a substrate to stress applied to the substrate, and when the modulus is relatively high, the strength may be relatively high. Accordingly, the plurality of second substrates 112 may be a plurality of rigid substrates that are more rigid than the first substrate 111. The modulus of the plurality of second substrates 112 may be a thousand times or larger than that of the first substrate 111, but is not limited thereto. The plurality of second substrates 112 each may be electrically connected by connecting lines 180.

The connecting lines 180 may be electrically connected by connecting pads disposed on each of the plurality of second substrates 112. Here, the pads disposed on each of the plurality of second substrates 112, for example, may be gate pads, data pads, and power pads. Since the connecting lines 180 are disposed on the first substrate 111, they may be made of a material including conductive particles in a stretchable material to cope with stretching. Accordingly, the connecting lines 180, as shown in FIG. 1, may have a straight shape. Meanwhile, although the connecting lines 180 are described as having a straight shape in an embodiment of the present disclosure, they may have a twisty wavy shape to cope with stretching. Further, the connecting lines 180 are not limited to the straight shape or the wavy shape and may have various shapes that can cope with stretching other than the straight shape and the wavy shape.

The lower substrate 110 may include a plurality of pixel areas PA defining unit cells, an active area AA including the plurality of pixel areas PA, and a non-active area NA surrounding the active area AA.

The plurality of pixel areas PA each may be an area defining a unit cell of the stretchable display device 1000. Each pixel area PA may be defined in an area where one second substrate 112 is disposed on the first substrate 111. That is, the pixel area PA may be defined as an area including one second substrate 112 and the first substrate 111 surrounding the second substrate 112. Alternatively, the pixel area PA may be defined as an area defining a middle point in the first direction X and a middle point in the second direction Y in the spacing area between adjacent second substrates 112 in accordance with the shape of the second substrates 112. An emitting element and various driving elements for driving the emitting element, for example, a switching thin film transistor, a driving thin film transistor, a capacitor, etc. are disposed on the second substrates 112 in the pixel area PA. Here, the emitting element may be any one of an organic light emitting element and a micro LED.

Overstretching suppression patterns 130 that suppress overstretching of the stretchable display device 1000 may be disposed in a boundary area of the pixel area PA. In general, stretchable display devices have maximum elongation. That is, stretchable display devices cannot be infinitely stretched due to their characteristics. However, when a user overstretches a stretchable display device in disregard of the maximum elongation, the stretchable display device may be damaged. Accordingly, in the stretchable display device 1000 according to an embodiment of the present disclosure, by disposing overstretching suppression pattern 130 that can suppress overstretching of a stretchable display panel 100 in the boundary area of the pixel area PA on the first substrate 111 made of a soft material, damage to the stretchable display device 1000 can be suppressed.

The overstretching suppression patterns 130 may be disposed on the first substrate 111. In more detail, the overstretching suppression pattern 130 may be disposed in spacing areas where the plurality of second substrates 112 is each spaced. The overstretching suppression pattern 130 may include a material having a large modulus than the first substrate 111. In more detail, the overstretching suppression pattern 130 may include a material having a modulus that is similar to or the same as that of the second substrates 112. Accordingly, the overstretching suppression pattern 130 may be a plurality of third substrates disposed on the first substrate 111. However, the overstretching suppression pattern 130 may have a size smaller than the size of the second substrates 112.

Further, the overstretching suppression pattern 130 may include a metal material. The overstretching suppression pattern 130 may be composed of a plurality of layers made of different materials. Such an overstretching suppression pattern 130 is described next in more detail with reference to FIGS. 2A to 12.

The active area AA is an area where images are displayed in the stretchable display device 1000. The active area AA includes the plurality of pixel areas PA. That is, the plurality of pixel areas PA may be disposed in a go board in the active area AA. The plurality of individual-shaped second substrates 112 is disposed in the active area AA on the first substrate 111 and is spaced and disposed with predetermined gaps.

The non-active area NA is an area adjacent to the active area AA. The non-active area NA may surround the active area AA, adjacent to the active area AA. The non-active area NA is an area where an image is not displayed, and lines, circuits, etc. may be disposed in the non-active area NA. For example, a driving circuit such as a gate driving circuit and a data driving circuit, and a plurality of signal pads and power pads may be disposed in the non-active area NA. The driving circuit and each of the pads may be connected with each of the plurality of pixels disposed in the active area AA. The plurality of second substrates 112 is made of a material that is more rigid than the first substrate 111 may be spaced and disposed with predetermined gaps in the non-active area NA, equally to the active area AA, on the first substrate 111 made of a bendable or stretchable material. The plurality of second substrates 112 is described as being spaced and disposed in the non-active area NA, equally to the active area AA, on the first substrate 111 with reference to FIG. 1. However, the present disclosure is not limited thereto and the non-active area NA may be composed of only the second substrates 112. The reason of disposing only the second substrates 112 in the non-active area NA or disposing a plurality of second substrates 112 on the first substrate 111 is for minimizing damage to the driving circuit or pads, etc. disposed in the non-active area NA. Accordingly, in the structure in which the plurality of second substrates 112 is spaced and disposed in the non-active area NA, driving elements that can drive a plurality of subpixels, for example, transistors or IC chips constituting a gate driving circuit or a data driving circuit, etc. may be disposed on each of the plurality of second substrates 112. The plurality of second substrates 112 disposed in the non-active area NA or the connecting lines 180 in the active area AA may electrically connect the second substrates 112 in the non-active area NA and the second substrates 112 in the active area AA to each other by extending.

The flexible connecting film 200, which is films having various components on a base film 210 made of a flexible material, is a component for supplying signals to the plurality of pixels disposed in the active area AA of the lower substrate 110. The flexible connecting film 200 is disposed between the display panel 100 and the printed circuit board 300 and transmits signals input from the printed circuit board 300 to the pixels disposed in the active area AA of the lower substrate 110. That is, the flexible connecting film 200 may be disposed between the lower substrate 110 of the display panel 100 and the printed circuit board 300 and may electrically connect the lower substrate 110 and the printed circuit board 300. The flexible connecting film 200 may be bonded to the plurality of bonding pads disposed in the non-active area NA and supplies a power voltage, a data voltage, a gate voltage, etc. to each of the plurality of pixels disposed in the active area AA through the bonding pads. The flexible connecting film 200 includes a base film 210 and a driving IC 220 and various other components may be disposed on the flexible connecting films 200.

The base film 210 is a layer supporting the driving IC 220. The base film 210 may be made of an insulating material, and more detail, the base film 210 may be made of an insulating material having flexibility such as polyimide (PI).

The driving IC 220 is a component that is disposed on the base film 210 and processes data for displaying images and driving signals for processing the data. Although the driving ICs 220 are shown as being mounted in a COF type in FIG. 1, the driving ICs 220 are not limited thereto and may be mounted in the type of Chip On Glass (COG), Tape Carrier Package (TCP), etc.

Controllers such as an IC chip and a circuit may be mounted on the printed circuit board 300. Further, a memory, a processor, etc. also may be mounted on the printed circuit board 300. The printed circuit board 300 is a configuration that transmits signals for driving the emitting elements from the controllers to the emitting elements.

The printed circuit board 300 may be electrically connected with the plurality of pixels disposed in the active area AA of the display panel 100 by being connected with the flexible connecting film 200.

The upper substrate 120 is a substrate overlapped with the lower substrate 110 to protect various components of the stretchable display device 1000. The upper substrate 120, which is a flexible substrate, may be made of a bendable or stretchable insulating material. For example, the upper substrate 120 may be made of a bendable or stretchable material and may be made of the same material as the first substrate 111 of the lower substrate 110, but is not limited thereto.

Though not shown in FIG. 1, the stretchable display device 1000 according to an embodiment of the present disclosure may further include a polarizing layer. The polarizing layer, which is a configuration suppressing external light reflection by the stretchable display device 1000, may be disposed on the upper substrate 120 while overlapped with the upper substrate 120. However, the polarizing layer is not limited thereto and, may be disposed under the upper substrate 120, may be disposed under the lower substrate 110, or may be omitted, depending on the configuration of the stretchable display device 1000.

FIGS. 2A to 13 are referred to hereafter to describe in more detail the stretchable display device 1000 according to an embodiment of the present disclosure.

Figure 2A:
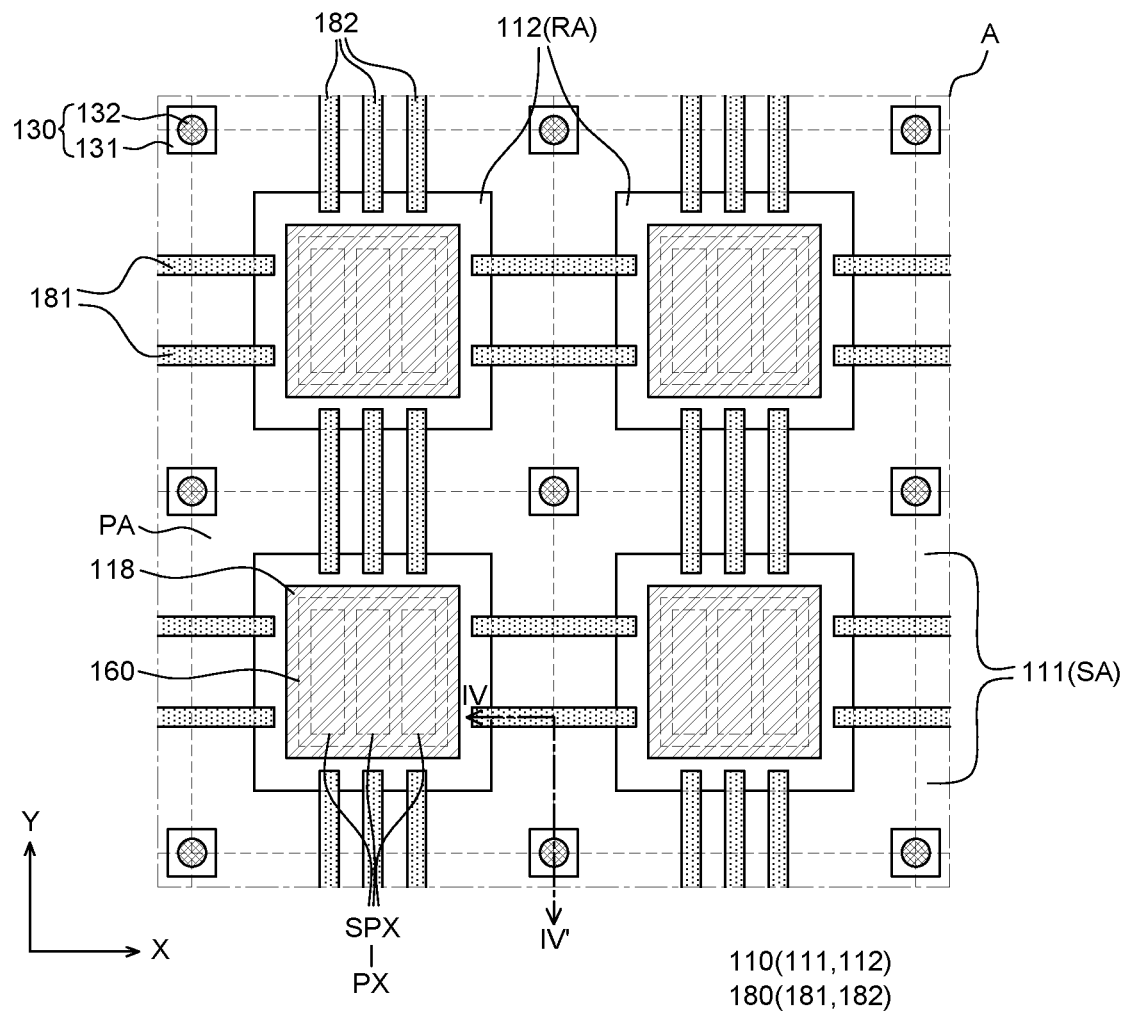
FIGS. 2A and 2B are enlarged plan views schematically showing a portion of an active area of a stretchable display device according to embodiments of the present disclosure.
Figure 2B:
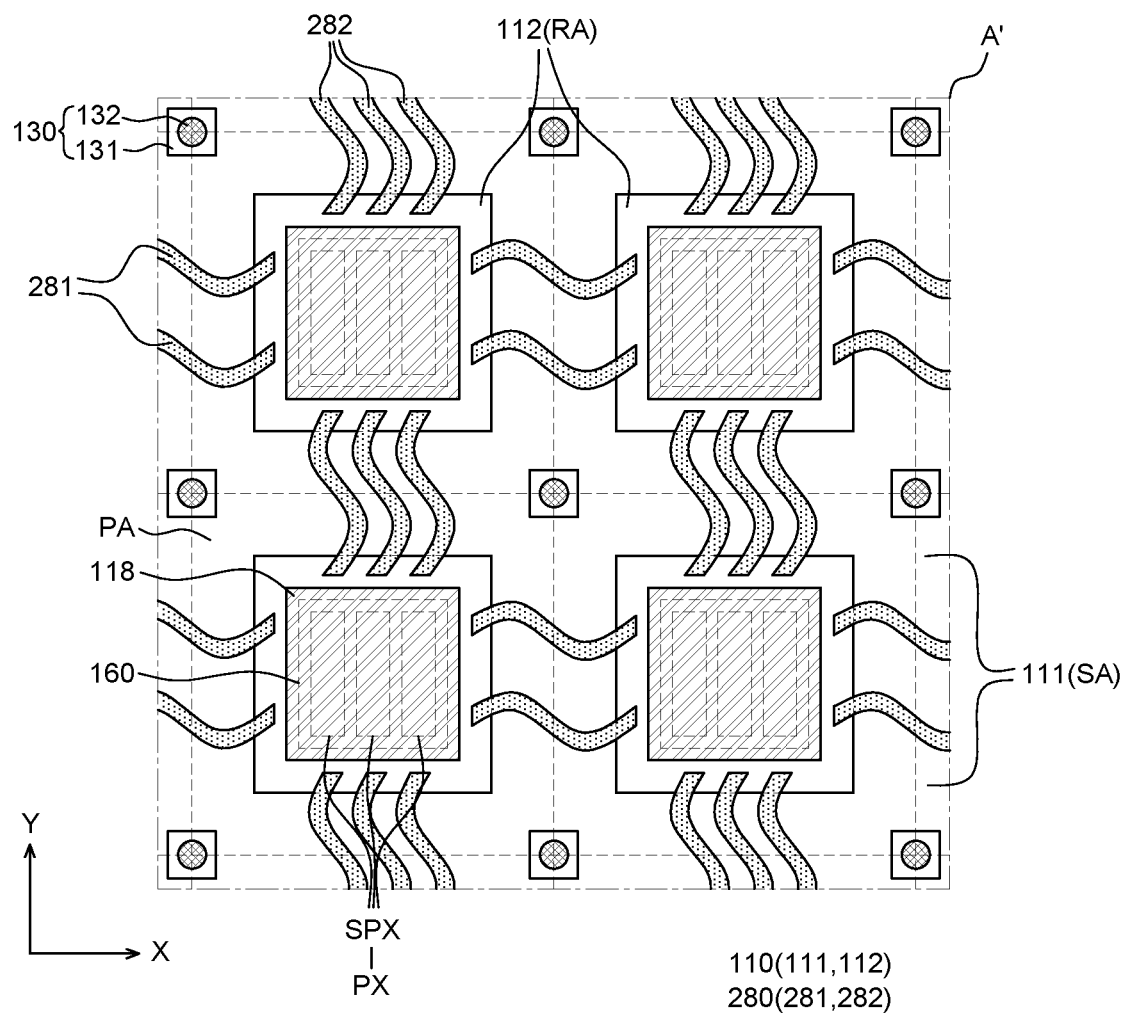
Figure 3:
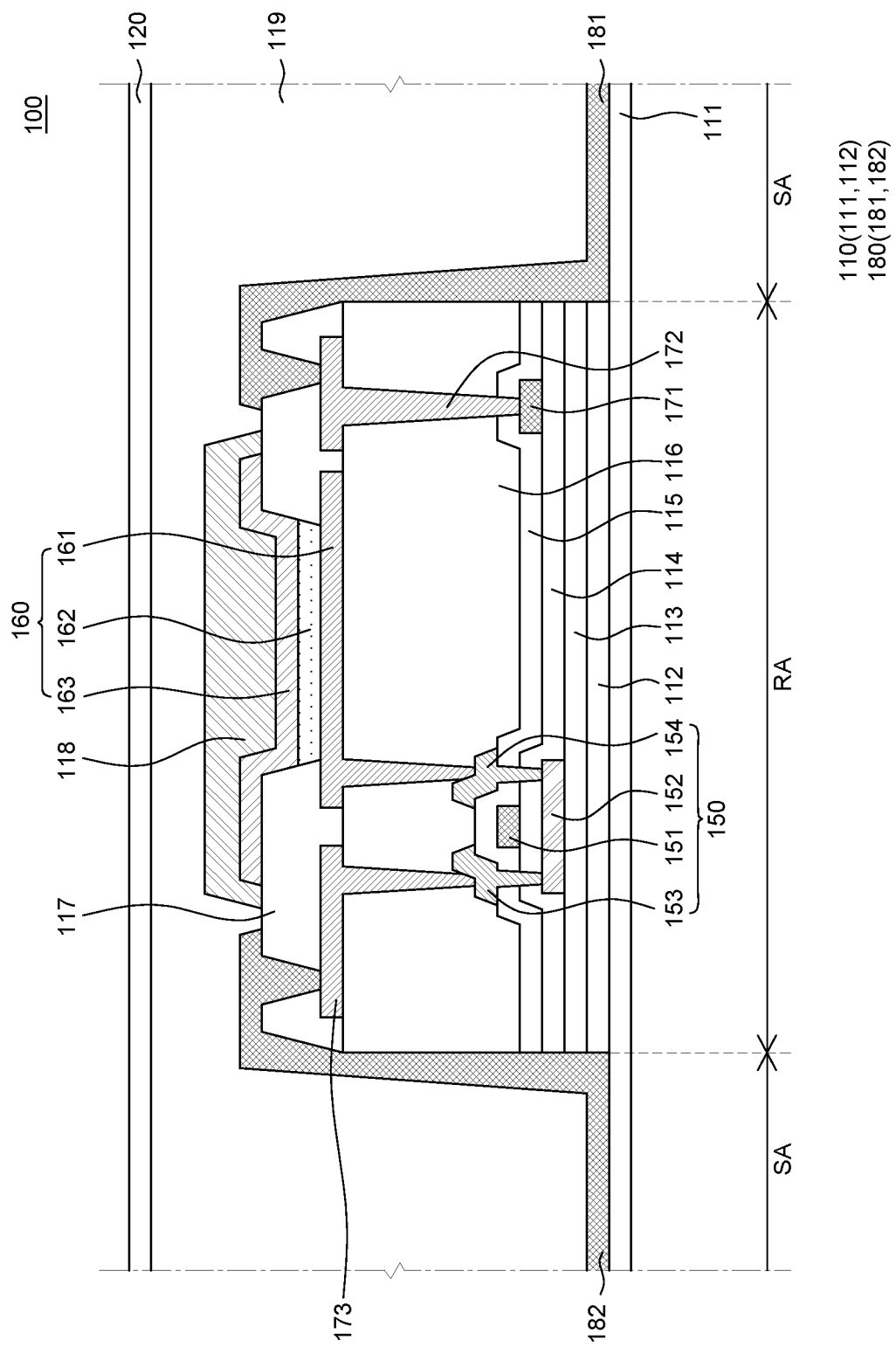
FIG. 3 is a cross-sectional view schematically showing a subpixel of FIG. 2A.
Figure 4A:
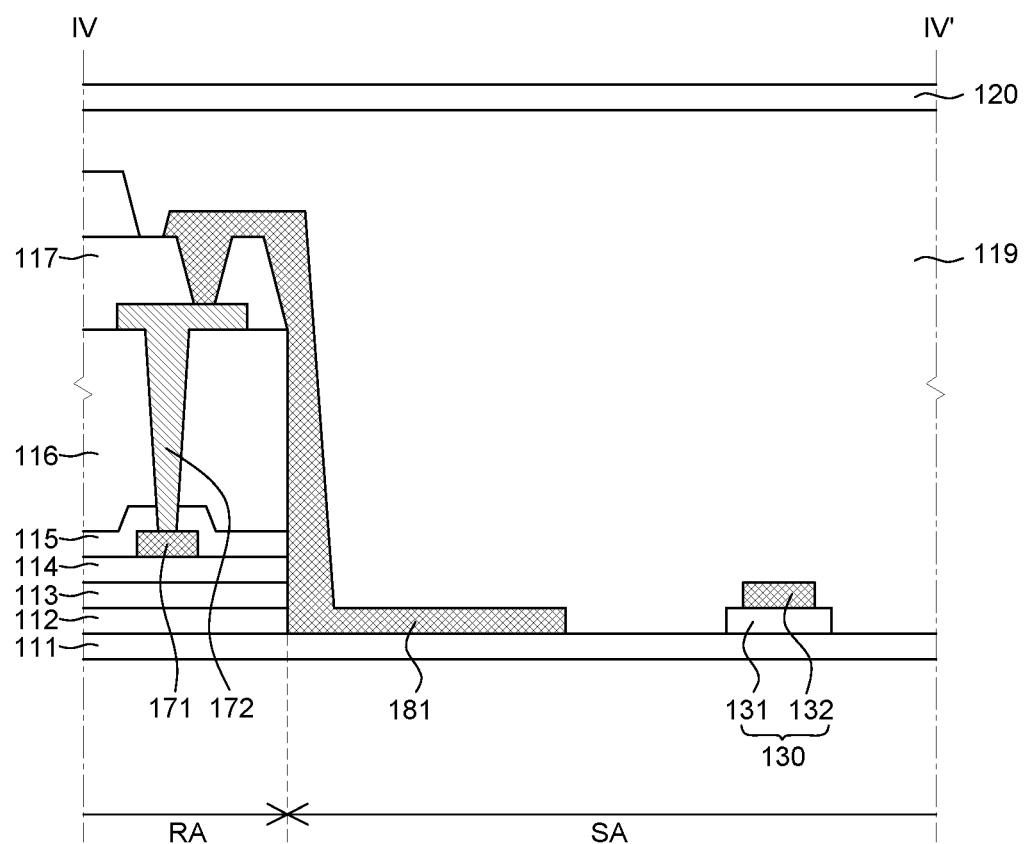
FIGS. 4A and 4B are cross-sectional views showing a portion of a pixel area taken along line IV-IV' of FIG. 2A according to an embodiment of the present disclosure.
Figure 4B:
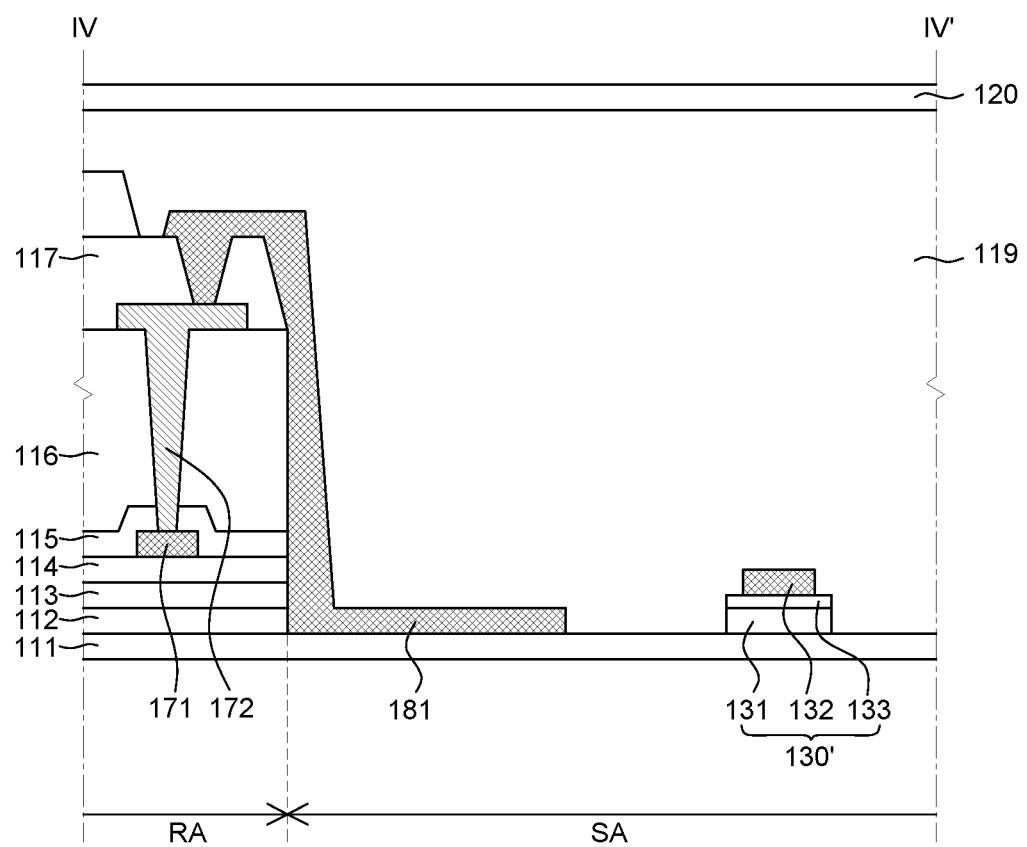
Figure 5:
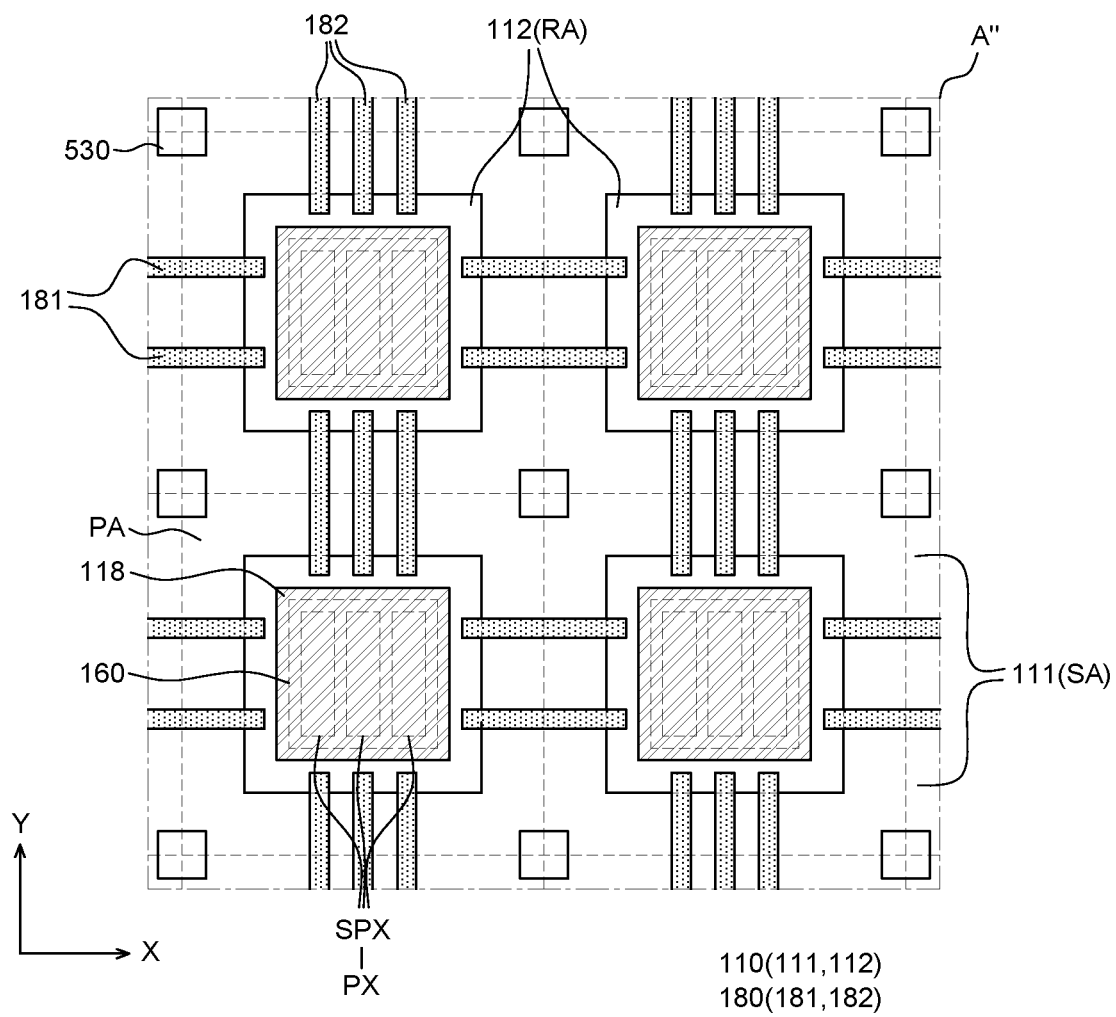
FIG. 5 is an enlarged plan view schematically showing a portion of an active area of a stretchable display device according to another embodiment of the present disclosure.

FIGS. 2A and 2B are enlarged plan views schematically showing a portion of an active area of a stretchable display device according to an embodiment of the present disclosure. FIG. 3 is a cross-sectional view schematically showing a subpixel of a stretchable display device according to an embodiment of the present disclosure. FIGS. 4A and 4B are cross-sectional views showing a portion of a pixel area taken along line IV-IV' of FIG. 2A. FIG. 5 is an enlarged plan view schematically showing a portion of an active area of a stretchable display device according to another embodiment of the present disclosure. Before referring to FIGS. 2A to 5, the stretchable display device 1000 shown in FIGS. 2A to 5 will be described by exemplifying a case when an emitting element is an organic light emitting element.

First, referring to FIGS. 2A and 2B, a first substrate 111, a plurality of second substrates 112 disposed on the first substrate 111, connecting lines 180 and 280 electrically connecting the plurality of second substrates 112, and a plurality of overstretching suppression patterns 130 disposed between the plurality of second substrates 112 and suppressing overstretching of the first substrate 111 may be disposed on a lower substrate 110 of the stretchable display device 1000 according to an embodiment of the present disclosure.

The first substrate 111, which is a base substrate of the lower substrate 110, may be made of a material that can reversibly expand and contract. The first substrate 111 may have an elastic modulus of several to hundreds of MPa and a tensile fracture rate of 100% or more. Accordingly, the first substrate 111 may be made of a bendable or stretchable insulating material, and for example, may be made of silicon rubber such as polydimethylsiloxane (PDMS) or an elastomer such as polyurethane (PU), but is not limited thereto. The plurality of second substrates 112, the plurality of connecting lines 180 for respectively electrically connecting the plurality of second substrates 112, and the plurality of overstretching suppression pattern 130 disposed in areas between the plurality of second substrates 112 are disposed on the first substrate 111.

The plurality of second substrates 112 is spaced apart from each other and disposed on the first substrate 111. At this time, the plurality of second substrates 112 each may be spaced with the same gaps. As such, the plurality of second substrates 112 is each spaced a predetermined distance, so the plurality of second substrates 112 may be disposed in a matrix shape on the first substrate 111, as shown in FIGS. 1 to 2B, but is not limited thereto.

The plurality of second substrates 112 may be made of a plastic material having flexibility and, for example, may be made of polyimide (PI), polyacrylate, polyacetate, etc. The plurality of second substrates 112 may have a large modulus value in comparison to the first substrate 111. For example, the modulus of the plurality of second substrates 112 may be a thousand times or larger than that of the first substrate 111, but is not limited thereto.

A pixel PX including an emitting element is disposed on each of the plurality of second substrates 112. The pixel PX includes sub-pixels SPX emitting light having a specific wavelength band, for example, respectively emitting red, green, and blue light. Although three subpixels SPX emitting red, green, and blue light is described in an embodiment of the present disclosure, the present disclosure is not limited thereto. For example, the pixels PX may further include a subpixel emitting white light other than the subpixels emitting red, green, and blue light. When a subpixel emitting white light is included, the stretchable display device 1000 according to an embodiment of the present disclosure may further include a color filter.

The subpixels SPX each may include a thin film transistor and an emitting element 160. The emitting element 160 may be any one of an organic light emitting element or a micro LED.

In common display devices, various lines such as a plurality of gate lines and a plurality of data lines are extended and disposed between a plurality of subpixels, and a plurality of subpixels is connected to one signal line. Accordingly, in common display devices, various lines such a gate line, a data line, a high-potential power line, and a reference voltage line extend from a side to the other side of the display devices on a substrate without disconnection.

In the stretchable display device 1000 according to an embodiment of the present disclosure, various lines such as gate lines, data lines, high-potential power lines, and reference voltage lines, which are made of a metal material, are disposed on the plurality of second substrates 112. That is, in the stretchable display device 1000 according to an embodiment of the present disclosure, various lines made of a metal material may be disposed on the plurality of second substrates 112 and may not be formed to be in contact with the lower substrate 111. Accordingly, various lines disposed in the stretchable display device 1000 may be patterned to correspond to the plurality of second substrates 112 and discontinuously disposed.

Meanwhile, referring to FIGS. 2A and 2B, in the stretchable display device 1000 according to an embodiment of the present disclosure, the pads on two adjacent second substrates 112 may be connected by the connecting lines 180 and 280 to connect the discontinuous lines. That is, the connecting lines 180 and 280 electrically connect the pads on two adjacent second substrates 112. Accordingly, the stretchable display device 1000 according to an embodiment of the present disclosure includes a plurality of connecting lines 180 and 280 to electrically connect various lines such as gate lines, data lines, high-potential power lines, and reference voltage lines between the plurality of second substrates 112.

Referring to FIGS. 2A and 2B, the connecting lines 180 and 280 electrically connect the plurality of second substrates 112 to each other. That is, the connecting lines 180 and 280 are disposed in spacing areas of the plurality of second substrates 112. The connecting lines 180 and 280 may be disposed between the pads disposed on the plurality of second substrates 112 and may electrically connect each pad. Accordingly, the stretchable display device 1000 according to an embodiment of the present disclosure includes a plurality of connecting lines 180 and 280 to electrically connect various lines such as gate lines, data lines, high-potential power lines, low-potential power lines, and reference voltage lines between the plurality of second substrates 112. For example, though not shown, a gate line made of a metal material may be disposed on the plurality of second substrates 112 disposed adjacent to each other in the first direction X and gate pads may be disposed at both ends of the gate line. The plurality of gate pads on the plurality of second substrates 112 disposed adjacent to each other in the first direction X each can be connected to each other by a connecting lines 180 and 280 functioning as a gate line. Accordingly, the gate lines disposed on the plurality of second substrates 112 and the connecting lines 180 and 280 disposed on the first substrate 111 may function as one gate line. All various lines that may be included in the stretchable display device 1000, such as the data lines, high-potential power lines, and reference voltage lines, also each can function as one line by connection lines 180 and 280, as described above.

Referring to FIGS. 2A and 2B, the connecting lines 180 electrically connect the pads disposed on adjacent second substrates 112 of the plurality of second substrates 112. At this time, as shown in FIG. 2A, the connecting lines 180 and 280 may extend in a straight shape each between the pads, and as shown in FIG. 2B, they may extend in a curved shape, for example, a sine waveform each between the pads. However, the shape of the connecting lines 180 and 280 is not limited to FIGS. 2A and 2B and may have various shapes, for example, they may extend in a zigzag shape or a plurality of diamond-shaped connecting lines extend with the apexes connected. In one instance, the connecting lines 180 may have a first part extending in the first direction, and a second part that extends along a side surface of a second substrate 112, or a side surface of any of the insulating layers on the second substrate 112, such that the connecting lines 180 can connect to the pads. The first part may adjoin the second part.

Meanwhile, as shown in FIG. 2A, when the connecting line 180 has a straight shape, the connecting lines 180 may be configured to include a base polymer that is a flexible material and conductive particles. In detail, the base polymer of the connecting line 180 may be made of a bendable or stretchable insulating material similar to the first substrate 111.

The base polymer, for example, may include silicon rubber such as polydimethylsiloxane (PDMS), an elastomer such as polyurethane (PU), styrene butadiene styrene (SBS), etc., but is not limited thereto. Accordingly, when the stretchable display device 1000 is bent or stretched, the base polymer may not be damaged. The base polymer may be formed by coating a material for the base polymer or applying the material using a slit to the top of the first substrate 111 and the bottom of the second substrates 112.

The conductive particles may be disposed in a distribution type in the base polymer. In detail, the connecting line 180 may include conductive particles distributed with predetermined density in the base polymer. The connecting line 180, for example, may be formed by uniformly stirring conductive particles in a base polymer and then coating and hardening the base polymer with the conductive particles distributed therein over the first substrate 111, under the second substrates 112, and under an adhesive layer, but is not limited thereto. The conductive particles may include at least one of silver (Ag), gold (Au), and carbon, but is not limited thereto.

The conductive particles disposed and distributed in the base polymer of the connecting line 180 may form a conductive path by electrically connecting the gate pads or the data pads respectively disposed on adjacent second substrates 112. Further, the conductive particles distributed in the base polymer of the connecting line 180 may form a conductive path electrically connecting a gate pad or a data pad formed on second substrates 112 disposed at the outermost side of the plurality of second substrates 112 to a pad disposed in the non-active area NA.

When the stretchable display device 1000 is bent or stretched, the first substrate 111 that is a flexible substrate may be deformed but the second substrates 112 that are rigid substrates having organic light emitting elements thereon may not be deformed. In this case, if the lines connecting each pad disposed on the plurality of second substrates 112 are not made of an easily bendable or stretchable material, the lines may be damaged, such as cracking, due to deformation of the lower substrate.

Accordingly, in the stretchable display device 1000 according to an embodiment of the present disclosure, it is possible to electrically connect the pads disposed on the plurality of second substrates 112, using the connecting lines 180 including a base polymer and conductive particles. The base polymer is soft to be able to easily deform. Accordingly, according to the stretchable display device 1000 of an embodiment of the present disclosure, even though the stretchable display device 1000 is deformed such as bending or stretching, the areas between the plurality of second substrates 112 are easily deformed by the connecting lines 180 including the base polymer.

Further, according to the stretchable display device 1000 of an embodiment of the present disclosure, since the connecting lines 180 include conductive particles, the conductive paths composed of the conductive particles may not be damaged such as cracking even by deformation of the base polymer. For example, when the stretchable display device 1000 is deformed such as bending or stretching, the first substrate 111 that is a flexible substrate may be deformed in the other areas excepting the areas where the plurality of second substrates 112 that is rigid substrates is disposed. The distance between the plurality of conductive particles disposed on the deforming first substrate 111 may be changed. The density of the plurality of conductive particles disposed at the upper portion of the base polymers and forming the conductive paths may be maintained at a high level to be able to transmit electrical signals even though the distance between the plurality of conductive particles is increased. Accordingly, even if the base polymers are bent or stretched, the conductive paths formed by the plurality of conductive particles may smoothly transmit electrical signals. Further, even though the stretchable display device 1000 is deformed such as bending or stretching, electrical signals may be transmitted each between the pads.

As such, since the connecting lines 180 of the stretchable display device 1000 according to an embodiment of the present disclosure are extended and disposed in a straight shape while including a base polymer and conductive particles, the connecting line 180 connecting each pad disposed on a plurality of adjacent second substrates 112 may make a shortest distance. Therefore, in the stretchable display device 1000 according to an embodiment of the present disclosure, it is possible to minimize the space occupied by the connecting lines 180.

Meanwhile, as shown in FIG. 2B, when the connecting lines 280 have a curved shape, the connecting lines 280, for example, may be made of a metal material such as copper (Cu), silver (Ag), and gold (Au). Accordingly, even though the connecting lines 280 are made of a metal material, the connecting lines 280 extend to have a curved shape on the first substrate 111, whereby damage to the connecting lines 280 may be minimized even though the stretchable display device 1000 is stretched.

Meanwhile, though not shown in FIG. 2B, when the connecting lines 280 are made of a metal material, a reinforcing material may be further disposed at least one of over and under the lines 280. A conductive reinforcing member may be a component that suppresses cutting of the connecting lines 280 when the stretchable display device 1000 is repeatedly stretched, and that helps electrical signal transmission by being in contact with the connecting lines 280 even if the connecting lines 280 are cut. The conductive reinforcing member may be a base polymer or a conductive polymer including conductive particles uniformly distributed in a base polymer. As a base polymer has an easily extending property, the conductive reinforcing member may have flexibility. Further, the conductive reinforcing member may be disposed in an area where disconnection may occur much of the connecting lines 280. For example, since the connecting lines 280 may be disconnected by a step between the first substrate 111 and the plurality of second substrates 112, the conductive reinforcing member may be disposed adjacent to sides of the plurality of second substrates 112. Specifically, a connecting line may have a first part extending between an adjacent pair of second substrates 112 and a second part that extends along a side surface of the second substrate 112 to contact the pad. The reinforcing member may be disposed on a portion of the connecting lines 180 and 280 in which the first part and the second part are adjoined.

Further, the conductive reinforcing member may include liquid metal. The liquid metal means metal existing in a liquid state at room temperature. For example, the liquid metal may include at least one of gallium, indium, natrium, lithium, and an alloy thereof, but is not limited thereto. When a crack is generated in the connecting lines 280, the liquid metal may fill the crack of the connecting lines 280. Accordingly, when the conductive reinforcing member includes liquid metal and the stretchable display device is deformed such as bending or stretching and a crack is generated in the connecting lines 280, the crack is filled with the liquid metal, so disconnection of the connecting lines 280 may be minimized. Further, the liquid metal has conductivity, so the entire resistance in the connecting lines 280 and the liquid metal may be reduced. Accordingly, electrical signals may be more smoothly transmitted between the pads on the plurality of second substrates 112.

Further, as shown in FIG. 2B, when the connecting lines 280 have a curved shape, the conductive reinforcing member may be disposed in a peak area of the connecting line 280. The peak area of the connecting lines 280 means an area where the amplitude of the curved connecting lines 280 is largest. For example, when the connecting lines 280 have a sine waveform, the point where the amplitude of the connecting lines 280 is largest may be defined as a peak area. When the stretchable display device is deformed such as bending or stretching, stress may concentrate on the peak area of the connecting lines 280, as compared with other areas of the connecting lines 280. In this case, the conductive reinforcing member may be disposed at the inner edge of the peak area of the connecting lines 280. The inner edge of the peak area of the connecting lines 280 may mean an area where a radius of curvature is relatively small in the peak area of the connecting lines 280 and the outer edge of the peak area may mean an area where the radius of curvature is relatively large in the peak area of the connecting lines 280. The conductive reinforcing member may be disposed at the inner edge of the peak area of the connecting lines 280 and under or over the connecting lines 280. When the stretchable display device 1000 is deformed such as bending or stretching, damage such as a crack or disconnection may be easily generated in the peak area of the connecting lines 280, particularly, at the inner edge of the peak area in comparison to other areas. Even if damage is generated in the peak area of the connecting lines 280 or at the inner edge of the peak area, the conductive reinforcing member may suppress blocking of an electrical signal, so transmission of electrical signals in the stretchable display device may be stably performed.

Referring to FIGS. 2A and 2B, the connecting lines 180 and 280 may include first connecting lines 181 and 281 and second connecting lines 182 and 282.

The first connecting lines 181 and 281 mean lines disposed in the first direction X on the lower substrate 110. The first connecting lines 181 and 281 may connect pads on two substrates 112 disposed in parallel of the pads on the plurality of second substrates 112 disposed adjacent to each other in the first direction X to each other. The first connecting lines 181 and 281 may extend between a pair of second substrates 112 arranged along a first direction. The first connecting lines 181 and 281 may function as gate lines or high-potential power lines, but are not limited thereto.

The second connecting lines 182 and 282 mean lines disposed in the second direction Y on the lower substrate 110. The second connecting lines 182 and 282 may connect pads on two second substrates 112 disposed in parallel of the pads on the plurality of second substrates 112 disposed adjacent to each other in the second direction Y to each other. The second connecting lines 182 and 282 may extend between another pair of second substrates 112 arranged along a second direction intersecting the first direction. The second connecting lines 182 and 282 may function as data lines, reference voltage lines, or low-potential power lines, but are not limited thereto.

In general, the stretchable display devices may have a bendable or stretchable property but may not be infinitely stretched. This is because when they are infinitely stretched, the display devices disposed on the second substrates 112 may be damaged. Accordingly, common stretchable display devices have a maximum elongation. Here, the maximum elongation may be defined as a limit up to which a stretchable display device may be stretched without influencing emitting elements. However, users that use stretchable display devices may use the stretchable display devices without considering the maximum elongation. Accordingly, in some cases, a stretchable display device exceeds the maximum elongation by excessive force of a user, so the display devices may be damaged, and thus, a problem that reliability of the stretchable display device is deteriorated may be generated. Accordingly, the stretchable display device 1000 according to an embodiment of the present disclosure may further include an overstretching suppression pattern 130 that is additionally disposed in the spacing areas between the plurality of second substrates 112 on the first substrate 111.

Referring to FIGS. 2A and 2B, the overstretching suppression pattern 130 may be disposed on the first substrate 111. A plurality of overstretching suppression patterns 130 may be disposed on the first substrate 111 and the plurality of overstretching suppression patterns 130 may be spaced and disposed apart from each other. At this time, the overstretching suppression patterns 130 may be disposed in spacing areas between adjacent second substrates 112.

The overstretching suppression patterns 130 each may be disposed in a plurality of pixel areas PA defined in a plurality of go board shapes on the first substrate 111. At this time, the pixel area PA may be defined as one second substrate 112 and the first substrate 111 surrounding the one second substrate 112. Such a pixel area PA, for example, may be defined as a rectangular shape and the overstretching suppression pattern 130 may be disposed in a boundary area of the pixel area PA. That is, the overstretching suppression patterns 130 may be disposed in the spacing areas in which the plurality of second substrates 112 is spaced, and may be disposed in spacing areas not overlapped with the connecting lines 180 and 280.

The overstretching suppression patterns 130 may be disposed at each corner of each pixel area PA in a plurality of pixel areas PA defined on the first substrate 111. Alternatively, the overstretching suppression patterns 130 may be disposed in the middle area of a flexible area between two adjacent second substrates 112. Meanwhile, although the overstretching suppression patterns 130 are shown as being disposed at every corner of each pixel area PA in an embodiment of the present disclosure, they are not limited thereto and may be disposed not at all corners of the pixel areas PA. The overstretching suppression patterns 130 may be disposed in areas that may suppress overstretching to suppress overstretching of the first substrate 111.

A plurality of overstretching suppression patterns 130 is disposed on the first substrate such that the stretchable display device 1000 is not overstretched. The plurality of overstretching suppression patterns 130 may be spaced and disposed in an individual type on the first substrate 111. At this time, the spacing distance between the plurality of overstretching suppression patterns 130 may be wider than the spacing distance between the plurality of second substrates 112. Further, one overstretching suppression pattern 130 may be smaller than the size of one second substrate 112.

Referring to FIGS. 2A and 2B, the overstretching suppression patterns 130 may be made of a rigid material. In more detail, the overstretching suppression patterns 130 may be made of a material that is the same as or similar to the second substrates 112, so the overstretching suppression patterns 130 may be referred to as third substrates. Thus, the overstretching suppression patterns 130 may have higher rigidity than the first substrate 111. Such overstretching suppression patterns 130 may include a first rigid portion 131 and a second rigid portion 132 made of a material different from the first rigid portion 131.

A plurality of first rigid portions 131 may be disposed in an individual shape on the first substrate 111. The first rigid portions 131 may have a large modulus value in comparison to the first substrate 111. For example, the modulus of the first rigid portions 131 may be a thousand times or more larger than that of the first substrate 111, but is not limited thereto.

The second rigid portion 132 is disposed on the first rigid portion 131 and may be made of a different material from the first rigid portion 131. In more detail, the second rigid portion 132 may be made of a material that is more rigid than the first rigid portion 131. Further, the second rigid portion 132 may have a size smaller than the first rigid portion 131. Meanwhile, although the second rigid portion 132 is shown as having a circular shape in FIGS. 2A and 2B in an embodiment of the present disclosure, it is not limited thereto. That is, the second rigid portion 132 may have various shapes such as a rectangle other than a circle. Meanwhile, although the overstretching suppression patterns 130 are shown as including the first rigid portion 131 and the second rigid portion 132, they are not limited thereto and may include another rigid material that is more rigid than the first substrate 111. Such overstretching suppression patterns 130 are described next in more detail with reference to FIGS. 4A and 4B to be described below.

As such, the overstretching suppression patterns 130 that may suppress overstretching of a display device are disposed on the first substrate 111 made of a soft material in the stretchable display device 1000 according to an embodiment of the present disclosure. Accordingly, even if a user applies force larger than the maximum elongation of the stretchable display device 1000, it is possible to suppress overstretching over the maximum elongation, so it is possible to minimize damage to the stretchable display device 1000 due to overstretching.

Meanwhile, referring to FIG. 3, the pixel area PA may be defined as a rigid area RA and a flexible area SA. The rigid area RA is an area that is formed in a size where one pixel may be disposed on the first substrate 111 and in which a second substrate 112 made of a material that is rigid more than the first substrate 111 is disposed. The flexible area SA, which is an area where the first substrate 111 is disposed, may be an area around the second substrate 112. As such, the area including the rigid area RA in which one second substrate 112 is disposed and the flexible area SA that is the area of the first substrate 111 surrounding the rigid area may be defined as a pixel area PA.

A second substrate 112 is disposed in the rigid area RA of the first substrate 111. A buffer layer 113 is disposed on the second substrate 112. The buffer layer 113 is formed on the second substrate 112 to protect various components of the stretchable display device 1000 from water $H_2O$ and oxygen $O_2$ that may permeate from the outside of the first substrate 111 and the second substrate 112 of the lower substrate 110. The buffer layer 113, however, may be omitted, depending on the structure or characteristics of the stretchable display device 1000.

At this time, the buffer layer 113 may be formed in an area overlapped with the second substrate 112. That is, the buffer layer 113 may be disposed in the rigid area RA. As described above, since the buffer layer 113 may be made of an inorganic material, it may be easily damaged, such as cracking, when the stretchable display device 1000 is stretched. Accordingly, the buffer layer 113 is patterned in the shape of the plurality of second substrates 112 without being formed in the area between the plurality of second substrates 112, that is, the flexible area SA, whereby it may be formed over the plurality of second substrates 112. Therefore, since the buffer layer 113 is formed in the rigid area RA overlapped with the plurality of second substrates 112 that are rigid substrates, it is possible to suppress damage to the buffer layer 113 even though the stretchable display device 1000 according to an embodiment of the present disclosure is deformed, such as, bending or stretching.

Referring to FIG. 3, a transistor 150 including a gate electrode 151, an active layer 152, a source electrode 153, and a drain electrode 154 is formed on the buffer layer 113. For example, the active layer 152 is formed on the buffer layer 113, and a gate insulating layer 114 for insulating the active layer 152 and the gate electrode 151 from each other is formed on the active layer 152. An inter-layer insulating layer 115 is formed to insulate the gate electrode 151, the source electrode 153, and the drain electrode 154 from each other, and the source electrode 153 and the drain electrode 154 that are in contact with the active layer 152 are formed on the inter-layer insulating layer 115.

A gate pad 171 is disposed on the gate insulating layer 114. The gate pad 171 is a pad for transmitting a gate signal to a plurality of subpixels SPX. The gate pad 171 may be made of the same material as the gate electrode 151, but is not limited thereto.

The gate insulating layer 114 and the inter-layer insulating layer 115 may be formed in the areas overlapped with the plurality of second substrates 112 by patterning. The gate insulating layer 114 and the inter-layer insulating layer 115 may also be made of an inorganic material, equally to the buffer layer 113, so they may be easily damaged such as cracking when the stretchable display device 1000 is stretched. Accordingly, the gate insulating layer 114 and the inter-layer insulating layer 115 may be formed in the rigid area RA without being formed in the area between the plurality of second substrates 112, that is, in the flexible area SA.

Only a driving transistor of various transistors that may be included in the stretchable display device 1000 is shown in FIG. 3 for the convenience of description, but a switching transistor, a capacitor, etc. may be included. Further, although the transistor 150 is described as having a coplanar structure in this specification, various transistors, for example, having a staggered structure also may be used.

A planarization layer 116 is formed on the transistor 150 and the inter-layer insulating layer 115. The planarization layer 116 is disposed to planarize the top of the transistor 150. The planarization layer 116 is made of one or more materials of polyacrylates resin, epoxy resin, phenolic resin, polyamides resin, polyimides resin, unsaturated polyesters resin, poly-phenylenethers resin, poly-phenylenesulfides resin, and benzocyclobutene, but is not limited thereto. The planarization layer 116 may have a contact hole for electrically connecting the transistor 150 and an anode 161, a contact hole for electrically connecting a data pad 173 and the source electrode 153, and a contact hole for electrically connecting a connecting pad 172 and a gate pad 171.

In some embodiments, a passivation layer may be formed between the transistor 150 and the planarization layer 116. That is, a passivation layer covering the transistor 150 may be formed to protect the transistor 150 from permeation of water, oxygen, etc. The passivation layer may be made of an inorganic material and may be composed of a single layer or a multi-layer, but is not limited thereto.

Referring to FIG. 3, the data pad 173, the connecting pad 172, and the organic light emitting element 160 are disposed on the planarization layer 116.

The data pad 173 may transmit a data signal from a second connecting line 182, which functions as a data line, to a plurality of subpixels SPX. The data pad 173 is connected with the source electrode 153 of the transistor 150 through a contact hole formed at the planarization layer 116. The data pad 173 may be made of the same material as the anode 161 of the organic light emitting element 160, but is not limited thereto. The data pad 173 may be made of the same material as the source electrode 153 and the drain electrode 154 of the transistor 150, not on the planarization layer 116, but on the inter-layer insulating film 115.

The connecting pad 172 may transmit a gate signal from a first connecting line 181, which functions as a gate line, to a plurality of subpixels SPX. The connecting pad 172 is connected with the gate pad 171 through contact holes formed at the planarization layer 116 and the inter-layer insulating layer 115 and transmits a gate signal to the gate pad 171. The connecting pad 172 may be made of the same material as the data pad 173, but is not limited thereto.

Meanwhile, the first connecting line 181 is described as transmitting a gate signal to a plurality of subpixels SPX by the gate pad 171 and the connecting pad 172 in FIG. 3. However, the first connecting line 181 is not limited thereto and may be disposed to extend toward the flexible area SA in direct contact with the gate pad 171 without the connecting pad 172. Further, the second connecting line 182 is also described as transmitting a data signal to a plurality of subpixels SPX by the separate data pad 173. However, the second connecting lines 182 is not limited thereto and the source electrode 153 of the transistor 150 may serve as a data pad, so the second connecting line 182 may be disposed to extend toward the flexible area SA in direct contact with the source electrode 153.

The organic light emitting elements 160 are components disposed to correspond to a plurality of subpixel SPX, respectively, and emit light having a specific wavelength band. That is, the organic light emitting element 160 may be a blue organic light emitting element that emits blue light, a red organic light emitting element that emits red light, a green organic light emitting element that emits green light, or a white organic light emitting element that emits white light, but is not limited thereto. When the organic light emitting element 160 is a white organic light emitting element, the stretchable display device 1000 may further include a color filter.

The organic light emitting element 160 includes an anode 161, an organic light emitting layer 162, and a cathode 163. In detail, the anode 161 is disposed on a planarization layer 116. The anode 161 is an electrode configured to supply holes to the organic light emitting layer 162. The anode 161 may be made of a transparent conductive material with a high work function. The transparent conductive material may include an Indium Tin Oxide (ITO), an Indium Zinc Oxide (IZO), or an Indium Tin Zinc Oxide (ITZO). When the stretchable display device 1000 is implemented in a top emission type, the anode 161 may further include a reflective plate.

The anodes 161 are spaced apart respectively for subpixels SPX and electrically connected with the thin film transistor 150 through contact holes of the polarization layer 116. For example, although the anode 161 is shown as being electrically connected with the drain electrode 154 of the transistor 150 in FIG. 3, the anode 161 may be electrically connected with the source electrode 153.

A bank 117 is formed on the anode 161, the data pad 173, the connecting pad 172, and the planarization layer 116. The bank 117 is a component separating adjacent subpixels SPX. The bank 117 is disposed to cover at least partially both sides of adjacent anodes 161, thereby partially exposing the top of the anode 161. The bank 117 may perform a role in suppressing the problem that an unexpected subpixel SPX emits light or colors are mixed by light emitted in the lateral direction of the anode 161 due to concentration of a current on the corner of the anode 161. The bank 117 may be made of acrylic-based resin, benzocyclobutene (BCB)-based resin, or polyimide, but is not limited thereto. Although the organic light emitting element 160 is described as being used as a light emitting element in this specification, the present disclosure is not limited thereto and a light emitting diode (a micro LED) may be used as the light emitting element.

The bank 117 has a contact hole for connecting the second connecting line 182 functioning as a data line and the data pad 173, and a contact hole for connecting the first connecting line 181 functioning as a gate line and the connecting pad 172.

The organic light emitting layer 162 is disposed on the anode 161. The organic light emitting layer 162 is configured to emit light. The organic light emitting layer 162 may include a luminescent material, and the luminescent material may include a phosphorous material or a fluorescent material, but is not limited thereto.

The organic light emitting layer 162 may be composed of one light emitting layer. Alternatively, the organic light emitting layer 162 may have a stacked structure in which a plurality of light emitting layers is stacked with charge generation layers therebetween. The organic light emitting layer 162 may further include at least one organic layer of a hole transporting layer, an electron transporting layer, a hole blocking layer, an electrode blocking layer, a hole injection layer, and an electron injection layer.

The cathode 163 is disposed on the organic light emitting layer 162. The cathode 163 supplies electrons to the organic light emitting layer 162. The cathode 163 may be made of Indium Tin Oxide (ITO)-based, Indium Tin Zinc Oxide (ITZO)-based, Zinc Oxide (ZnO)-based, or Tin Oxide (TO)-based transparent conductive oxides or an Ytterbium (Yb) alloy. Alternatively, the cathode 163 may be made of a metal material.

The cathodes 163 may be formed by patterning to respectively overlap the plurality of second substrates 112. That is, the cathodes 163 may be formed in the areas overlapped with the plurality of second substrates 112, that is, the rigid area RA, and may be disposed not to be formed in the areas between the plurality of second substrates 112, that is, the flexible area SA. Since the cathodes 163 are made of a transparent conductive oxide or a metal material, when the cathodes 163 are formed even in the areas between the plurality of second substrates 112, the cathodes 163 may be damaged when the stretchable display device 1000 is stretched. Accordingly, the cathodes 163 may be formed to respectively correspond to the plurality of second substrates 112 in a plane.

Referring to FIGS. 2A and 3, an encapsulation layer 118 is disposed on the organic light emitting element 160. The encapsulation layer 118 may seal the organic light emitting element 160 by covering the organic light emitting element 160 in contact with a portion of the top of the bank 117. Accordingly, the encapsulation layer 118 protects the organic light emitting element 160 from water, air, or physical shock that may permeate from the outside.

The encapsulation layers 118 respectively cover the cathodes 163 patterned to respectively overlap the plurality of second substrates 112 and may be formed on the plurality of second substrates 112, respectively. That is, the encapsulation layer 118 is disposed to cover one cathode 163 disposed on one second substrate 112 and the encapsulation layers 118 respectively disposed on the plurality of second substrates 112 may be spaced apart from each other.

The encapsulation layer 118 may be disposed in the rigid area RA. That is, the encapsulation layer 118 may be formed in an area overlapped with the second substrate 112. As described above, since the encapsulation layers 118 may be configured to include an inorganic layer, they may be easily damaged, such as cracking, when the stretchable display device 1000 is stretched. In particular, since the organic light emitting element 160 is vulnerable to water or oxygen, when the encapsulation layer 118 is damaged, reliability of the organic light emitting element 160 may be reduced. Therefore, since the encapsulation layers 118 are not formed in the areas between the plurality of second substrates 112, that is, the flexible areas SA, damage to the encapsulation layers 118 may be minimized even though the stretchable display device 1000 according to an embodiment of the present disclosure is deformed, such as, bending or stretching.

Compared with common flexible organic light emitting display devices of the related art, the stretchable display device 1000 according to an embodiment of the present disclosure has a structure in which the plurality of second substrates 112 that are relatively rigid is spaced apart from each other and disposed on the first substrate 111 that is relatively soft. Further, the cathodes 163 and the encapsulation layers 118 of the stretchable display device 1000 are disposed by patterning to correspond to the plurality of second substrates 112, respectively. That is, the stretchable display device 1000 according to an embodiment of the present disclosure may have a structure that enables the stretchable display device 1000 to be more easily deformed when a user stretches or bends the stretchable display device 1000 and may have a structure that may minimize damage to the components of the stretchable display device 1000 when the stretchable display device 1000 is deformed.

Referring to FIG. 4A, an overstretching suppression pattern 130 may be disposed on a flexible area SA in which the first substrate 111 is disposed. At this time, the overstretching suppression pattern 130 may be spaced and disposed apart from a connecting line 180 in the flexible area SA. In more detail, the overstretching suppression pattern 130 may be disposed at each corner of each pixel area PA in a plurality of pixel areas PA defined on the first substrate 111. Alternatively, the overstretching suppression pattern 130 may be disposed in the middle area of a flexible area between two adjacent second substrates 112. The overstretching suppression pattern 130 may be made in an individual shape. At this time, the size of overstretching suppression pattern 130 may be smaller than the size of the second substrate 112.

The overstretching suppression pattern 130 may include a first rigid portion 131 and a second rigid portion 132. The first rigid portion 131 and the second rigid portion 132 may be made of different materials.

The first rigid portion 131 may be made of an organic material or an inorganic material of which the elongation is smaller than 10%. The first rigid portion 131, for example, may be made of a plastic material having the same flexibility as the second substrate 112, for example, polyimide (PI), polyacrylate, polyacetate, etc.

The second rigid portion 132 is disposed on the first rigid portion 131 and may be made of a different material from the first rigid portion 131. The second rigid portion 132 may be made of a material having higher rigidity than the first rigid portion 131, for example, metal such as copper (Cu), silver (Ag), and gold (Au). The second rigid portion 132 may have a size equal to or smaller than the first rigid portion 131.

The second rigid portion 132 may serve as an etch stopper when the first rigid portion 131 is formed. In more detail, the first rigid portion 131 is patterned through a dry etch process. That is, the first rigid portion 131 may be formed in a manner that the material constituting the first rigid portion 131 remains only in the area where there is the second rigid portion 132, which is made of a metal material or an inorganic material, in accordance with the kind or content ratio of gas in the dry etch process. Accordingly, the second rigid portion 132 may serve as an etch stopper.

Meanwhile, the overstretching suppression pattern 130 included in the stretchable display device 1000 according to an embodiment of the present disclosure, as described in FIG. 4A, is not composed of only the first rigid portion 131 and the second rigid portion 132 and may further include a third rigid portion 133 between the first rigid portion 131 and the second rigid portion 132, as shown in FIG. 4B.

Referring to FIG. 4B, an overstretching suppression pattern 130' may be disposed in the flexible area SA where the first substrate 111 is disposed. At this time, the overstretching suppression pattern 130' may be spaced and disposed apart from a connecting line 180 in the flexible area SA. In more detail, the overstretching suppression pattern 130' may be disposed at each corner of each pixel area PA in a plurality of pixel areas PA defined on the first substrate 111. Alternatively, the overstretching suppression pattern 130' may be disposed in the middle area of a flexible area between two adjacent second substrates 112. The overstretching suppression pattern 130' may be made in an individual shape. At this time, the size of overstretching suppression pattern 130' may be smaller than the size of the second substrate 112.

The overstretching suppression pattern 130' may include a first rigid portion 131, a second rigid portion 132, and a third rigid portion 133. The first rigid portion 131, the second rigid portion 132, and the third rigid portion 133 each may be made of a different material.

The first rigid portion 131 may be made of an organic material or an inorganic material of which the elongation is smaller than 10%. The first rigid portion 131, for example, may be made of a plastic material having the same flexibility as the second substrate 112, for example, polyimide (PI), polyacrylate, polyacetate, etc.

The second rigid portion 132 is disposed on the first rigid portion 131 and may be made of a different material from the first rigid portion 131. The second rigid portion 132 may be made of a material having higher rigidity than the first rigid portion 131, for example, metal such as copper (Cu), silver (Ag), and gold (Au). The second rigid portion 132 may have a size equal to or smaller than the first rigid portion 131.

The second rigid portion 132 may serve as an etch stopper when the third rigid portion 133 disposed on the first rigid portion 131 is formed. In more detail, the third rigid portion 133 is patterned through a dry etch process. That is, the third rigid portion 133 may be formed in a manner that the material constituting the third rigid portion 133 remains only in the area where there is the second rigid portion 132, which is made of a metal material or an inorganic material, in accordance with the kind or content ratio of gas in the dry etch process. Accordingly, the second rigid portion 132 may serve as an etch stopper of the third rigid portion 133.

The third rigid portion 133 may be disposed between the first rigid portion 131 and the second rigid portion 132. The third rigid portion 133 may be made of an insulating material, and for example, may be composed of a single inorganic layer or a multi-inorganic layer made of a silicon nitride (SiNx), a silicon oxide (SiOx), or silicon oxynitride (SiON).

Meanwhile, although the overstretching suppression patterns 130 and 130' of the stretchable display device 1000 described above are described as being formed by stacking a plurality of rigid portions made of different materials, they are not limited thereto. For example, they may be disposed as single layers as patterns for suppressing overstretching of the stretchable display device 1000.

Referring to FIG. 5, overstretching suppression patterns 530 may be made of an organic material or an inorganic material of which the elongation is smaller than 10%. The overstretching suppression patterns 530, for example, may be made of a plastic material having the same flexibility as the second substrate 112, for example, polyimide (PI), polyacrylate, polyacetate, etc. That is, the overstretching suppression patterns 530 of a stretchable display device according to another embodiment of the present disclosure may be made of a rigid material made of only a material that is the same as or similar to the second substrate 112 and may be disposed as a single layer.

As such, the overstretching suppression patterns 130, 130', and 530 made of a rigid material are disposed in spacing areas of each of the plurality of second substrates 112 in the stretchable display device 1000 according to an embodiment of the present disclosure, thereby improving degree of integration of the rigid material. Accordingly, even though the same stress as the related art is applied, it is possible to suppress damage to the stretchable display device 1000 by attenuating stress due to stretch.

Figure 6:
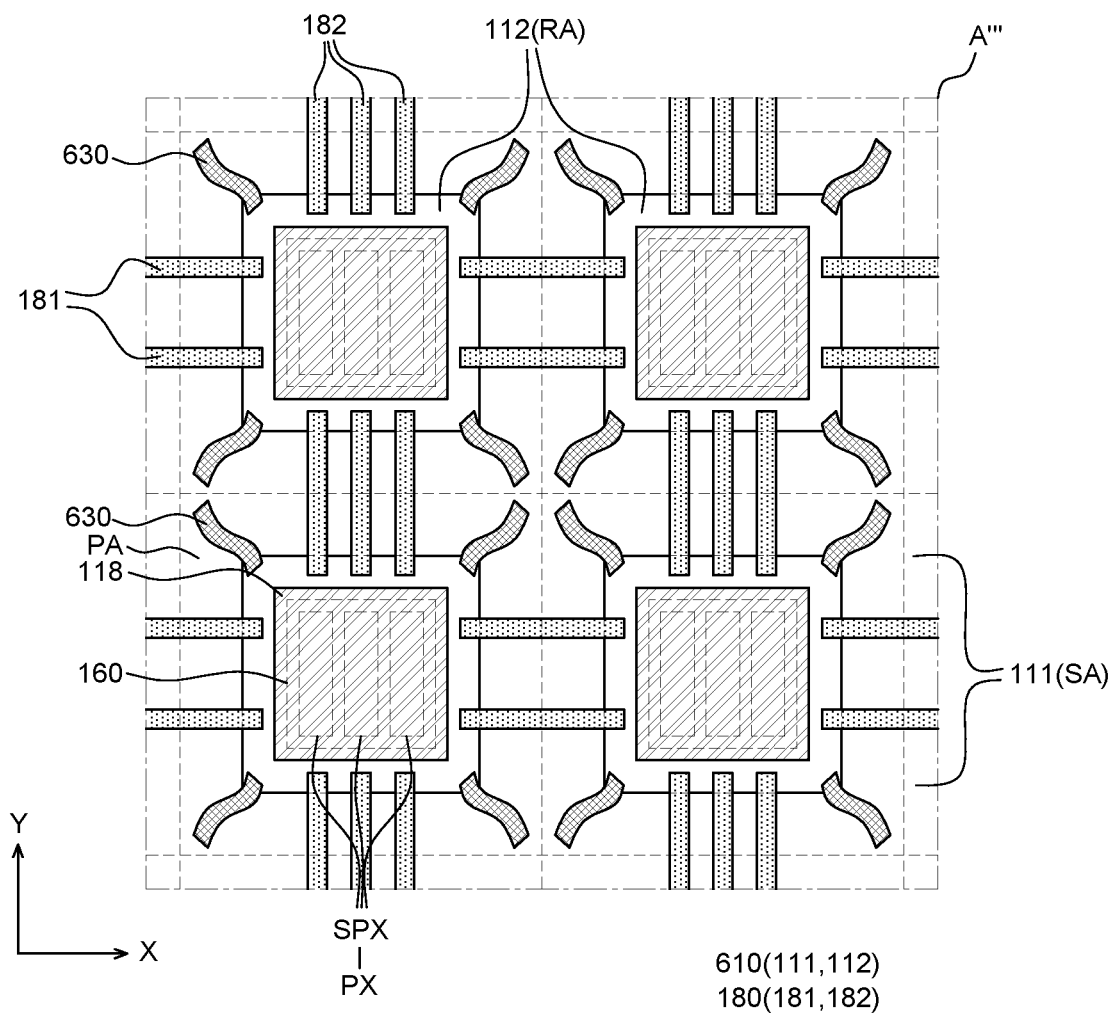
FIGS. 6 and 7 are enlarged plan views schematically showing a portion of an active area of a stretchable display device according to another embodiment of the present disclosure.
Figure 7:
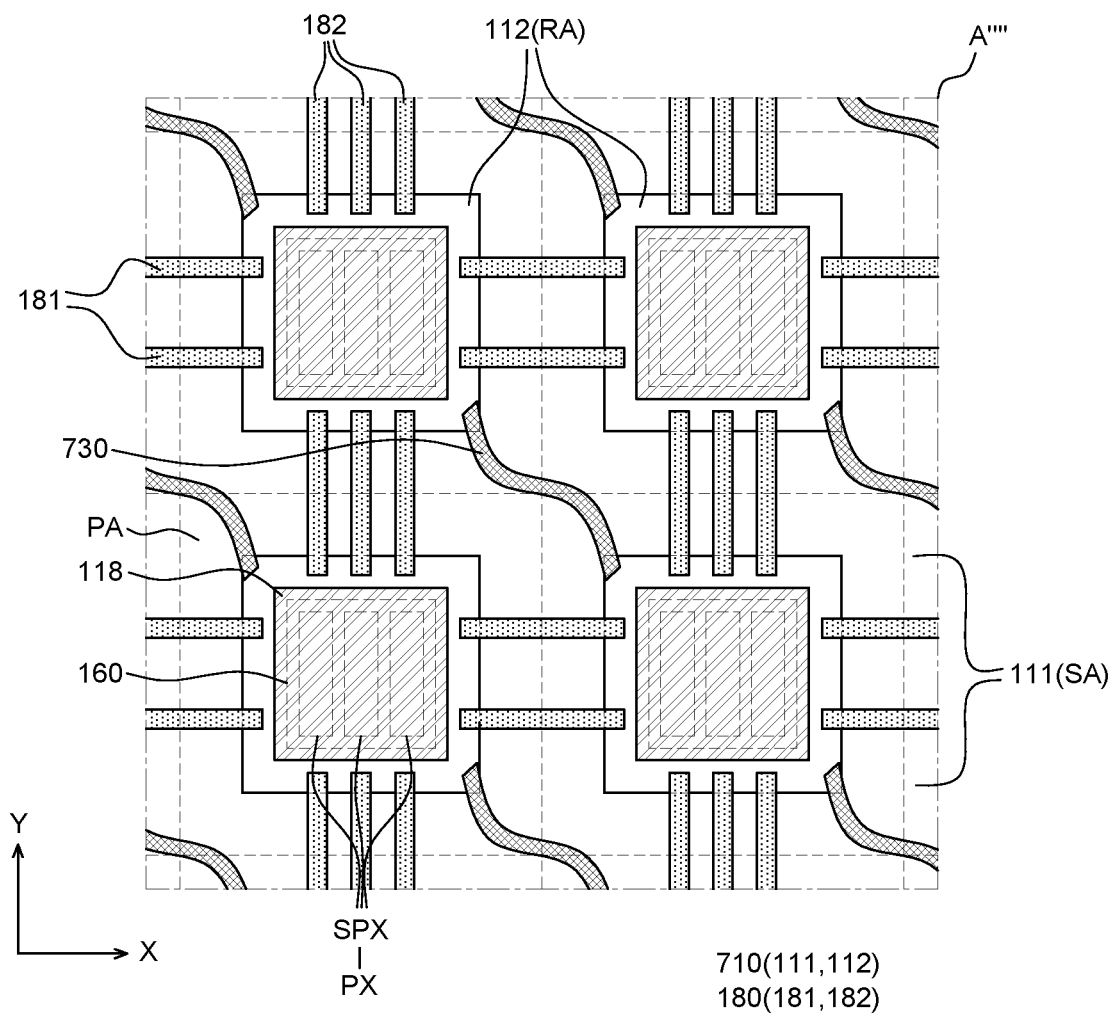

FIGS. 6 and 7 are enlarged plan views schematically showing a portion of an active area of a stretchable display device according to another embodiment of the present disclosure.

Referring to FIGS. 6 and 7, a first substrate 111, a plurality of second substrates 112 disposed on the first substrate 111, connecting lines 180 electrically connecting the plurality of second substrates 112, and a plurality of overstretching suppression patterns 630 and 730 disposed between the plurality of second substrates 112 and suppressing overstretching of the first substrate 111 may be disposed on lower substrates 610 and 710 of the stretchable display device according to another embodiment of the present disclosure. The embodiment shown in FIGS. 6 and 7 is the same in the substantial configuration as the embodiment shown in FIG. 2A except that the shapes of the overstretching suppression patterns 630 and 730 are different, so repeated description for the same reference numerals is omitted.

First, referring to FIG. 6, the overstretching suppression pattern 630 may be disposed on the first substrate 111. A plurality of pixel areas PA of a go board shape may be defined on the first substrate 111 and the overstretching suppression pattern 630 may be disposed in each of the plurality of pixel areas PA. In more detail, each pixel area PA may be defined by one second substrate 112 and the first substrate 111 surrounding the one second substrate 112 and the overstretching suppression pattern 630 may be disposed in an overstretching suppression line type connected with a corner of the second substrate 112.

The overstretching suppression patterns 630 are disposed not to be overlapped the connecting lines 180 on the first substrate 111. Referring to FIG. 6, the connecting line 180 is disposed to extend in a first direction X and a second direction Y that is a direction intersecting the first direction X, such as a direction perpendicular to the first direction X, and the overstretching suppression pattern 630 may be disposed in a direction between the first direction X and the second direction Y. That is, the overstretching suppression pattern 630 may extend in a diagonal direction of the pixel area PA defined in a rectangular shape. However, the overstretching suppression pattern 630 is not disposed to connect adjacent pixel areas PA or adjacent second substrate 112 and may be disposed in a disconnected type in each pixel area PA. Although overstretching suppression patterns 630 of a disconnected line type are shown as being disposed at all of four corners of a second substrate 112 in one pixel area PA in FIG. 6, they are not limited thereto and may be disposed at not all corners, but at least one of the second substrate 112 in one pixel area PA.

The overstretching suppression patterns 630 may be made of an organic material or an inorganic material of which the elongation is smaller than 10%. The overstretching suppression patterns 630, for example, may be made of a plastic material having the same flexibility as the second substrate 112, for example, polyimide (PI), polyacrylate, polyacetate, etc. Although the overstretching suppression patterns 630 are described as being made of a plastic material having flexibility in the embodiment of FIG. 6, they are not limited thereto. For example, the overstretching suppression patterns 630 may be disposed in line type in which a metal material is further disposed on a plastic material having flexibility.

Referring to FIG. 6, the overstretching suppression patterns 630 may have a wavy or curvy shape. This is for coping with stretch of the first substrate 111 made of a soft material. However, the shape of the overstretching suppression patterns 630 is not limited thereto and may have a shape that may cope with stretch other than the wavy shape.

As such, the overstretching suppression patterns 630 of a line type are further disposed in areas where the connecting lines 180 are not disposed on the first substrate 111 that is a flexible area in one pixel area PA in a stretchable display device according to another embodiment of the present disclosure. Accordingly, it is possible to suppress damage to the stretchable display device by overstretching by distributing stress due to stretch.

Further, the overstretching suppression patterns 730 having a line type in comparison to the overstretching suppression patterns 130 having an individual type are disposed in a stretchable display device according to another embodiment of the present disclosure with reference to FIG. 7. Accordingly, the area that distributes stretch stress is larger than when the overstretching suppression patterns 130 are disposed in an individual type, so it is possible to more efficiently suppress damage to the stretchable display device.

Meanwhile, referring to FIG. 7, the overstretching suppression pattern 730 may be disposed on the first substrate 111. A plurality of pixel areas PA of a go board shape may be defined on the first substrate 111 and the overstretching suppression pattern 730 may be disposed in each of the plurality of pixel areas PA. At this time, the overstretching suppression pattern 730 may be disposed to connect any one pixel area PA and a pixel area PA adjacent to the any one pixel area PA and disposed in a diagonal direction. In more detail, the overstretching suppression pattern 730 may be disposed in a line type that connects a second substrate 112 disposed in any one pixel area PA and a second substrate 112 disposed in another pixel area PA disposed in a diagonal direction to the second substrate 112 disposed in the any one pixel area PA.

Referring to FIG. 7, the overstretching suppression patterns 730 are disposed not to be overlapped the connecting lines 180 on the first substrate 111. Accordingly, the overstretching suppression patterns 730 are disposed such that the connecting lines 180 are disposed to extend in a first direction X and a second direction Y that is a direction intersecting the first direction X, such as a direction perpendicular to the first direction X, that is, may be disposed in a direction between the first direction X and the second direction Y. That is, the overstretching suppression pattern 730 may extend in the diagonal direction of the pixel area PA defined in a rectangular shape and may connect any one pixel area PA and another pixel area PA adjacent to the any one pixel area PA.

The overstretching suppression pattern 730 may be made of an organic material or an inorganic material of which the elongation is smaller than 10%. The overstretching suppression patterns 730, for example, may be made of a plastic material having the same flexibility as the second substrate 112, for example, polyimide (PI), polyacrylate, polyacetate, etc. For example, the overstretching suppression patterns 730 may be disposed in line type in which a metal material is further disposed on a plastic material having flexibility.

That is, the overstretching suppression patterns 730 make the second substrate 112 disposed in any one pixel area PA and the second substrate 112 disposed in another pixel area PA disposed adjacent to the any one pixel area PA not be electrically connected. Although one overstretching suppression pattern 730 is shown as being disposed in the diagonal direction in FIG. 7, a plurality of the overstretching suppression patterns 730 may be disposed.

Referring to FIG. 7, the overstretching suppression patterns 730 may have a wavy or curvy shape. This is for coping with stretching of the first substrate 111 made of a soft material. However, the shape of the overstretching suppression patterns 730 is not limited thereto and may have a shape that may cope with stretch other than the wavy shape.

As such, the overstretching suppression pattern 730, which connects the second substrate 112 disposed in any one pixel area PA and the second substrate 112 disposed in another pixel area PA disposed adjacent to the any one pixel area PA is disposed in a direction different from the direction in which the connecting line 180 extends in a stretchable display device according to another embodiment of the present disclosure. Accordingly, it is possible to suppress damage to the stretchable display device by distributing force in a stretch direction.

Figure 8:
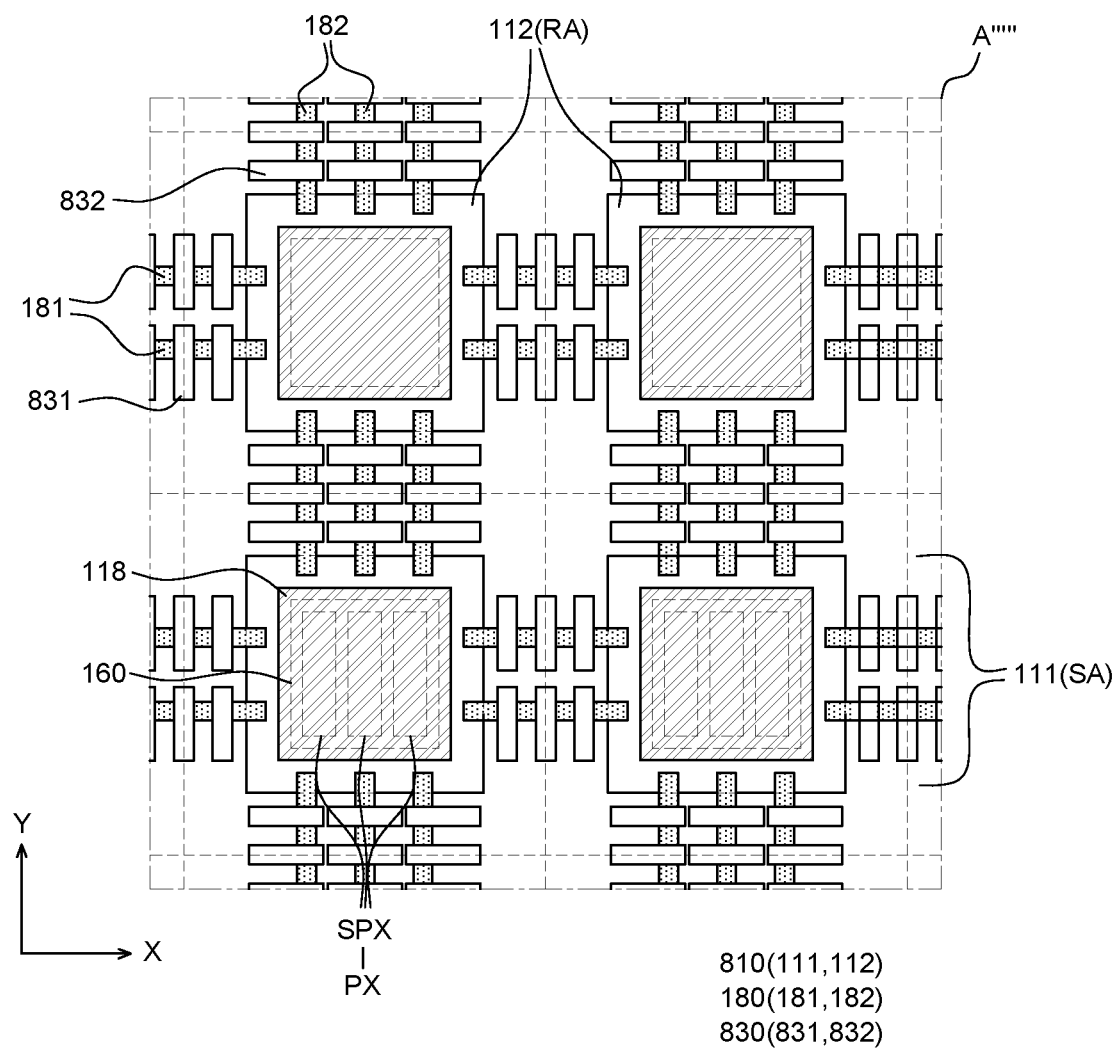
FIG. 8 is an enlarged plan view schematically showing a portion of an active area of a stretchable display device according to another embodiment of the present disclosure.
Figure 9:
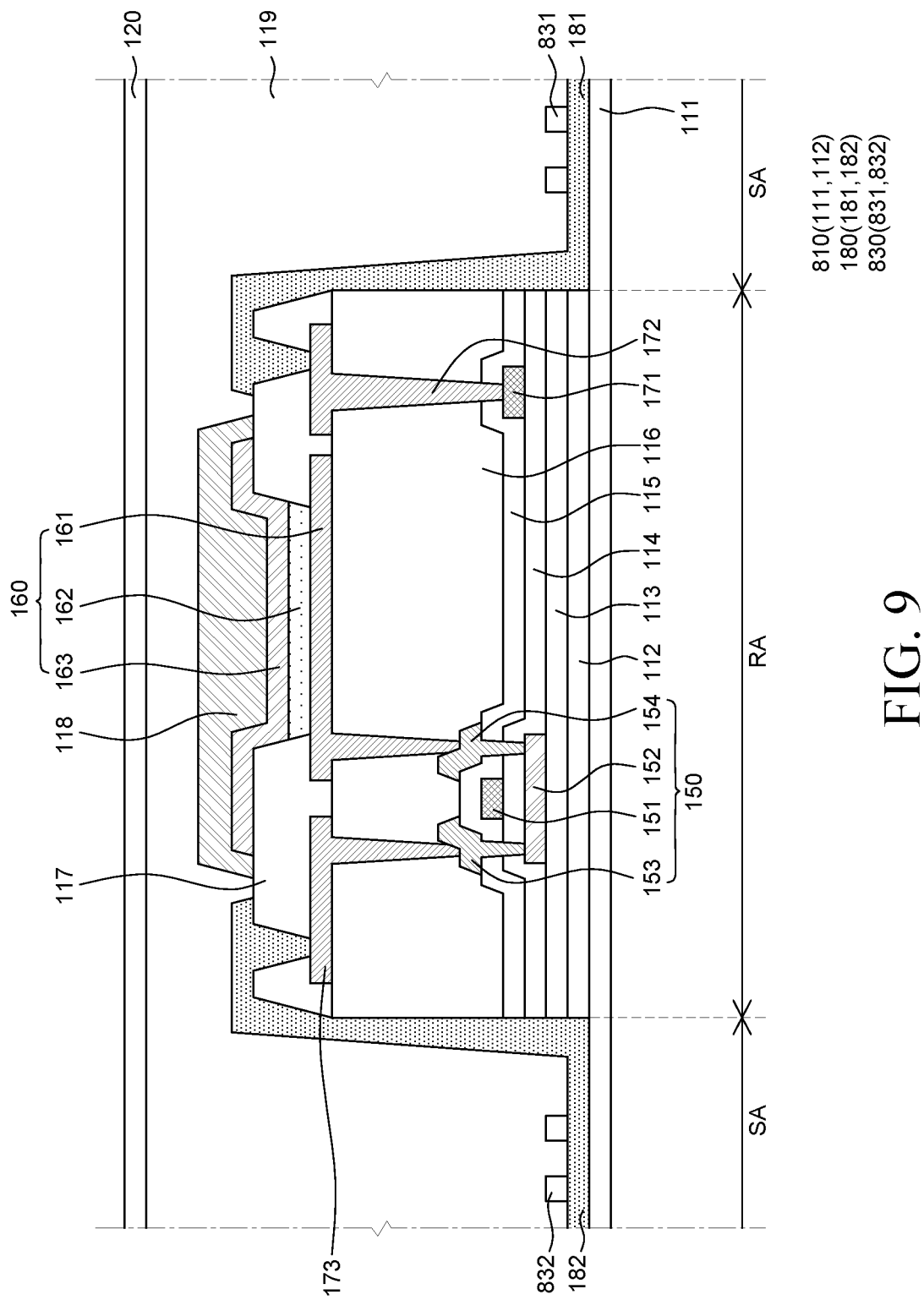
FIG. 9 is a cross-sectional view schematically showing a subpixel of FIG. 8.

FIG. 8 is an enlarged plan view schematically showing a portion of an active area of a stretchable display device according to another embodiment of the present disclosure. FIG. 9 is a cross-sectional view schematically showing a subpixel of FIG. 8.

Referring to FIGS. 8 and 9, a first substrate 111, a plurality of second substrates 112 disposed on the first substrate 111, connecting lines 180 electrically connecting the plurality of second substrates 112, and a plurality of overstretching suppression patterns 830 disposed on the connecting lines 180 may be disposed on a lower substrate 810 of the stretchable display device according to another embodiment of the present disclosure. The embodiment shown in FIGS. 8 and 9 is the same in the substantial configuration as the embodiment shown in FIGS. 2A and 3 except that the disposition and shape of the overstretching suppression patterns 830 are different, so repeated description for the same reference numerals is omitted.

Referring to FIGS. 8 and 9, the overstretching suppression pattern 830 may be disposed on the first substrate 111 to overlap a connecting line 180. A plurality of overstretching suppression patterns 830 may be disposed on one connecting line 180. For example, the overstretching suppression patterns 830 may be disposed in a slit type on one connecting line 180. Further, referring to FIGS. 8 and 9, the plurality of overstretching suppression patterns 830 disposed on one connecting line 180 may be spaced and disposed with predetermined gaps.

Referring to FIG. 8, the extension direction of the connecting lines 180 and the extension direction of the overstretching suppression patterns 830 disposed on the connecting lines 180 may be different from each other. In more detail, when a first connecting line 181 is disposed to extend in a first direction X, a first overstretching suppression pattern 831 disposed on the first connection line 181 may also be disposed to extend in a second direction Y. When a second connecting line 182 is disposed to extend in the second direction Y, a second overstretching suppression pattern 832 disposed on the second connecting line 182 may also be disposed to extend in the first direction X.

The overstretching suppression pattern 830 may be made of an organic material or an inorganic material of which the elongation is smaller than 10%. The overstretching suppression patterns 830, for example, may be made of a plastic material having the same flexibility as the second substrate 112, for example, polyimide (PI), polyacrylate, polyacetate, etc.

Referring to FIG. 8, the overstretching suppression patterns 830 may have a straight shape. Since the overstretching suppression pattern 830 is disposed in a slit type on each of the connecting lines 180, it is not influenced by overstretching even if it is disposed in a straight shape.

As such, since a plurality of overstretching suppression patterns 830 is disposed in a slit type on a connecting line 180 in the stretchable display device according to another embodiment of the present disclosure, it is possible to distribute stretch stress that is applied around the connecting line 180 and suppress cutting of the connecting line 180.

Figure 10:
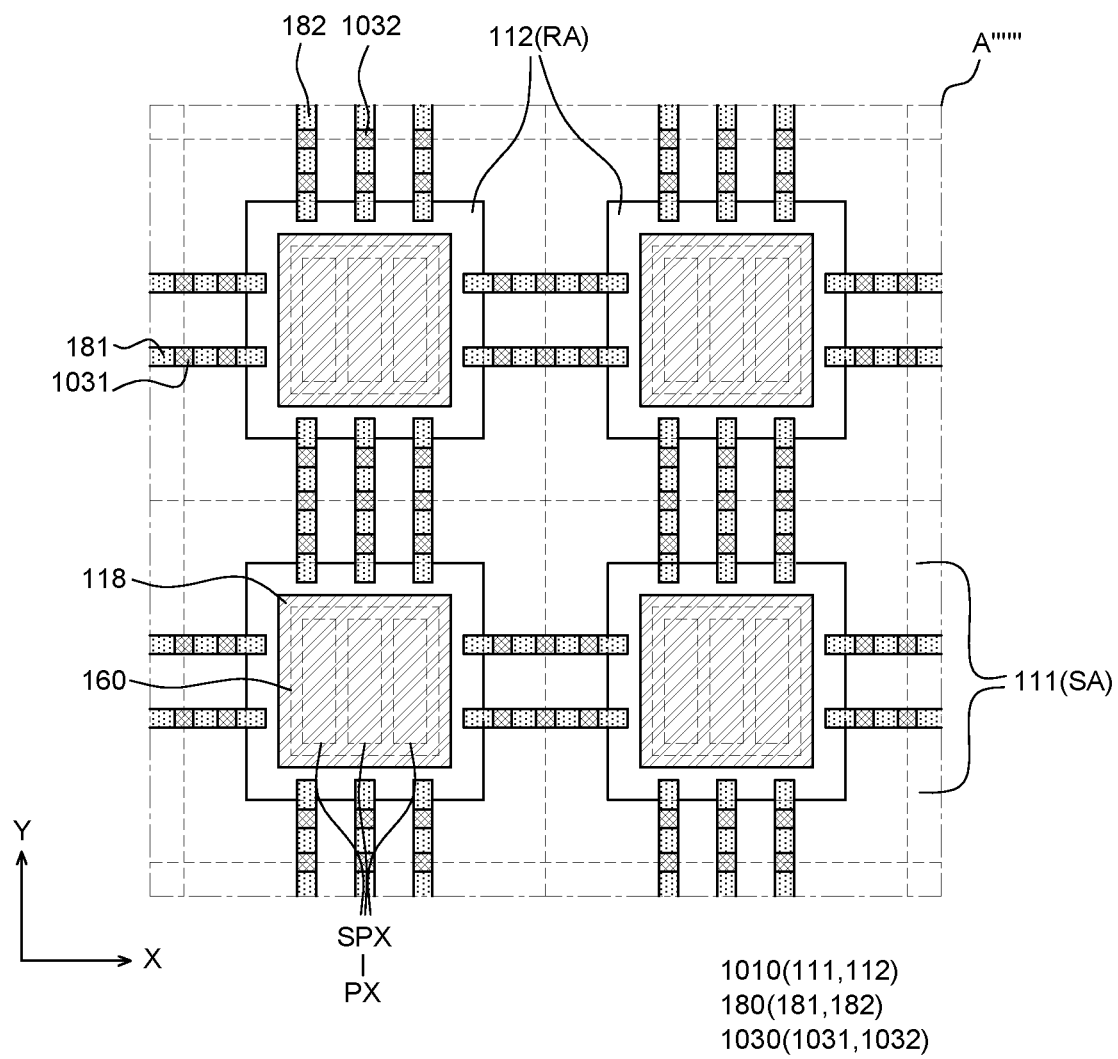
FIG. 10 is an enlarged plan view schematically showing a portion of an active area of a stretchable display device according to another embodiment of the present disclosure.
Figure 11:
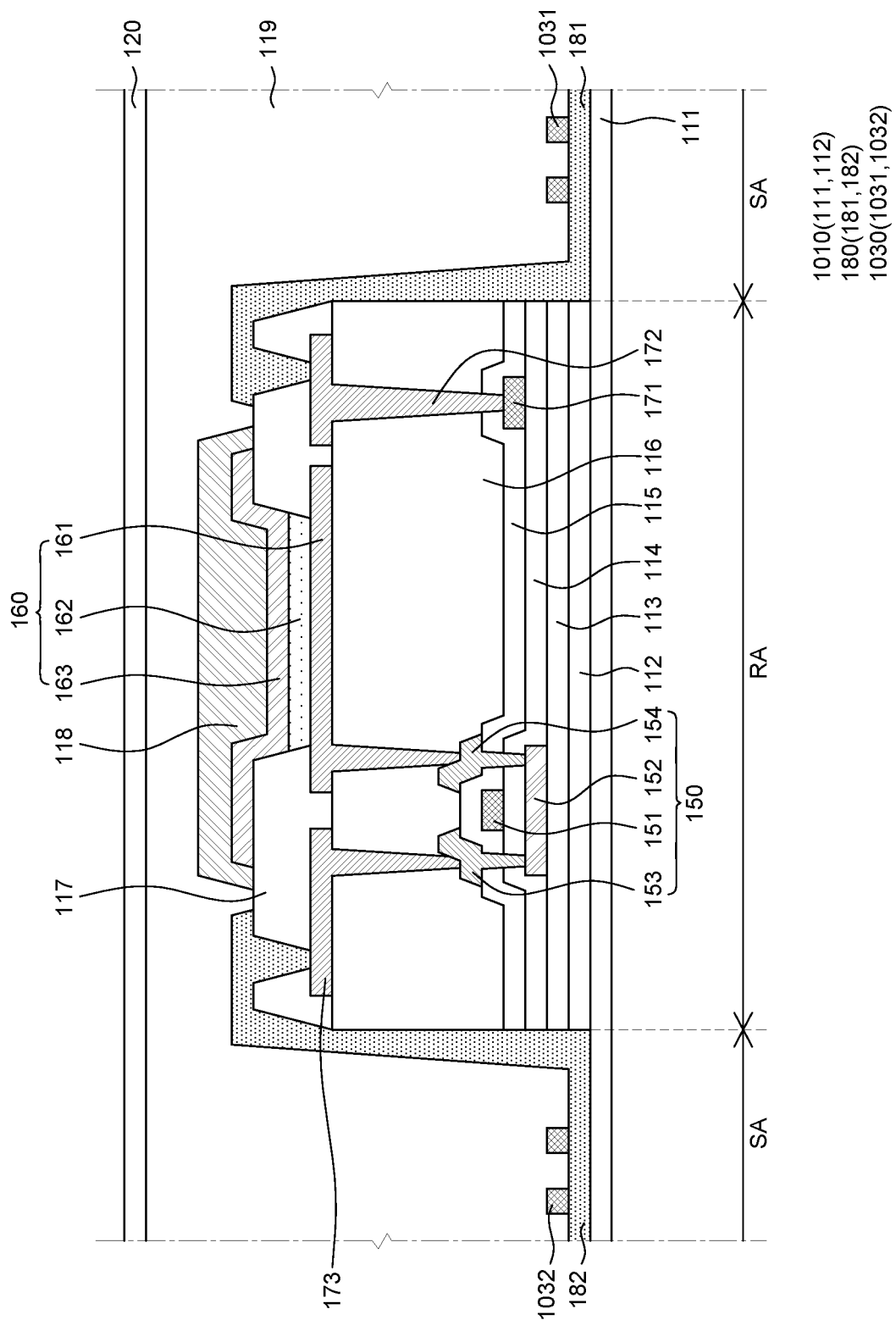
FIG. 11 is a cross-sectional view schematically showing a subpixel of FIG. 10 according to an embodiment of the present disclosure.
Figure 12:
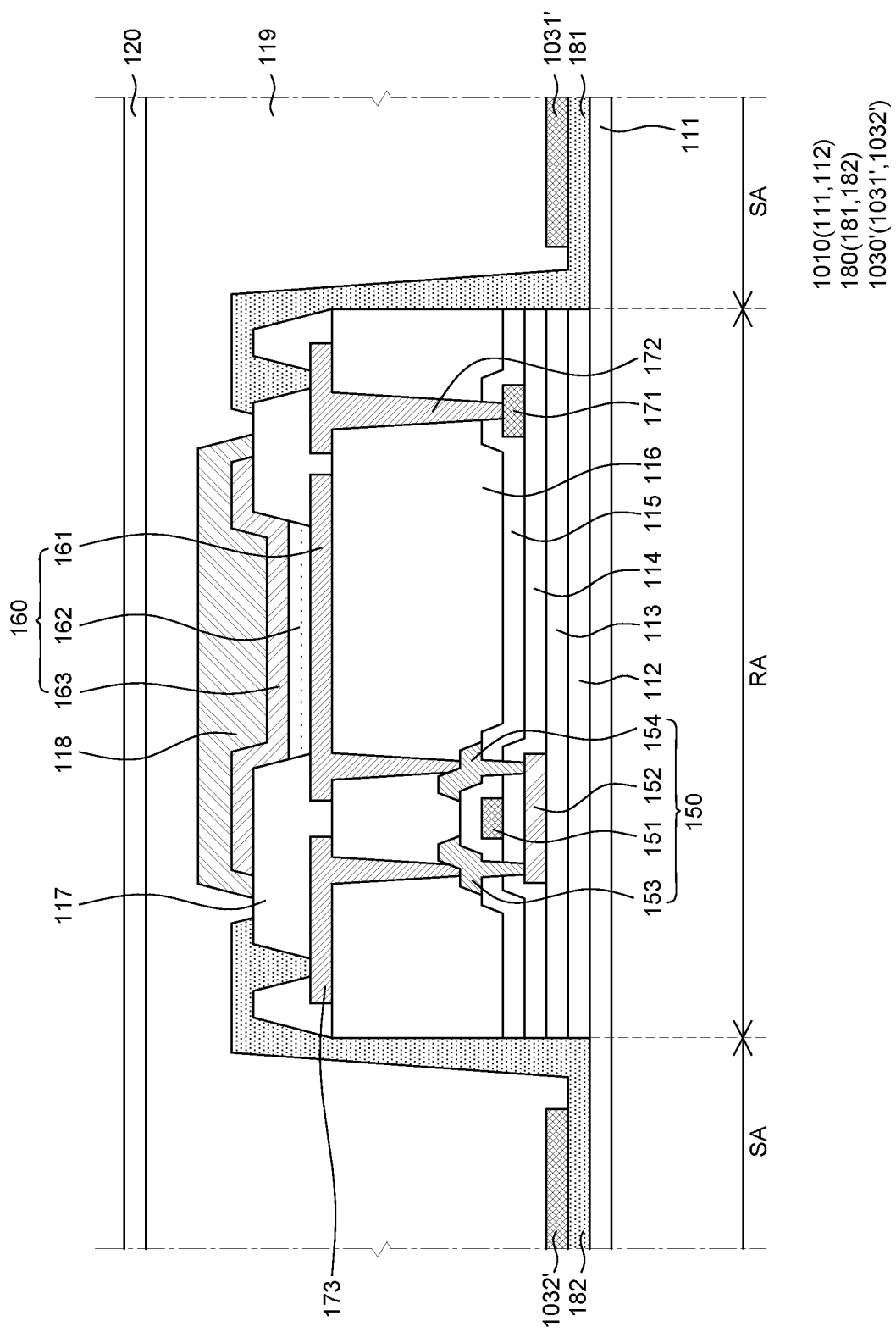
FIG. 12 is a cross-sectional view schematically showing another embodiment of the subpixel of FIG. 10.

FIG. 10 is an enlarged plan view schematically showing a portion of an active area of a stretchable display device according to another embodiment of the present disclosure. FIG. 11 is a cross-sectional view schematically showing a subpixel of FIG. 10. FIG. 12 is a cross-sectional view schematically showing another embodiment of the subpixel of FIG. 10.

Referring to FIGS. 10 to 12, a first substrate 111, a plurality of second substrates 112 disposed on the first substrate 111, connecting lines 180 electrically connecting the plurality of second substrates 112, and a plurality of overstretching suppression patterns 1030 and 1030' disposed on the connecting lines 180 may be disposed on a lower substrate 1010 of the stretchable display device according to another embodiment of the present disclosure. The embodiment shown in FIGS. 10 to 12 is the same in the substantial configuration as the embodiment shown in FIGS. 2A and 3 except that the disposition and shape of the overstretching suppression patterns 1030 and 1030' are different, so repeated description for the same reference numerals is omitted.

First, referring to FIGS. 10 and 11, the overstretching suppression pattern 1030 may be disposed on the first substrate 111 to be overlapped the connecting line 180. A plurality of overstretching suppression patterns 1030 may be disposed on one connecting line 180. For example, the overstretching suppression patterns 1030 may be disposed in a slit type on one connecting line 180. Further, referring to FIGS. 10 and 11, the plurality of overstretching suppression patterns 1030 disposed on one connecting line 180 may be spaced and disposed with predetermined gaps.

Referring to FIG. 10, the overstretching suppression patterns 1030 is disposed not to exceed the connection line 180 on a plane. In some embodiments, when a first connecting line 181 is disposed to extend in a first direction X, a first overstretching suppression pattern 1031 disposed on the first connection line 181 may also be disposed to extend in a second direction Y. When a second connecting line 182 is disposed to extend in the second direction Y, a second overstretching suppression pattern 1032 disposed on the second connecting line 182 may also be disposed to extend in the first direction X.

Referring to FIGS. 10 and 11, the overstretching suppression patterns 1030 may be made of a metal material. The overstretching suppression patterns 1030 may be made of copper (Cu), silver (Ag), gold (Au), etc. However, although the overstretching suppression patterns 1030 are shown as being directly disposed on the connecting lines 180 in FIGS. 10 and 11, a protective film made of an inorganic material may be further disposed between the connecting lines 180 and the overstretching suppression patterns 1030.

Referring to FIG. 10, the overstretching suppression patterns 1030 may be disposed in a slit type on the connecting lines 180. However, the overstretching suppression patterns 1030 are not limited to the type shown in FIGS. 10 and 11, and as shown in FIG. 12, may be disposed not in a slit type on flexible areas SA, but in a straight type on the connecting lines 180. However, as shown in FIG. 12, when the overstretching suppression patterns 1030' are disposed to cover the connecting line 180 on a flexible area SA, the overstretching suppression patterns 1030' may have a length shorter than the length of the connecting line 180. Accordingly, the overstretching suppression patterns 1030' suppress overstretching of the stretchable display device that is stretched, thereby being able to suppress damage to the stretchable display device.

As such, on a connecting line 180, a plurality of overstretching suppression patterns 1030 of a silt type made of a metal material is disposed or overstretching suppression patterns 1030' are disposed to have a length shorter than the connecting line 180 in the stretchable display device according to another embodiment of the present disclosure. Accordingly, it is possible to distribute stretch stress that is applied around the connecting line 180 and suppress cutting of the connecting line 180. In some embodiments, a plurality of overstretching suppression patterns may be disposed to have a width narrower than the connecting line.

Meanwhile, as described above, the stretchable display device according to an embodiment of the present disclosure is described by exemplifying an organic light emitting element as an emitting element. However, the light emitting elements of the stretchable display device 1000 may be micro LEDs. Next, the structure of one subpixel when the light emitting elements of the stretchable display device 1000 according to an embodiment of the present disclosure are micro LEDs is described hereafter.

Figure 13:
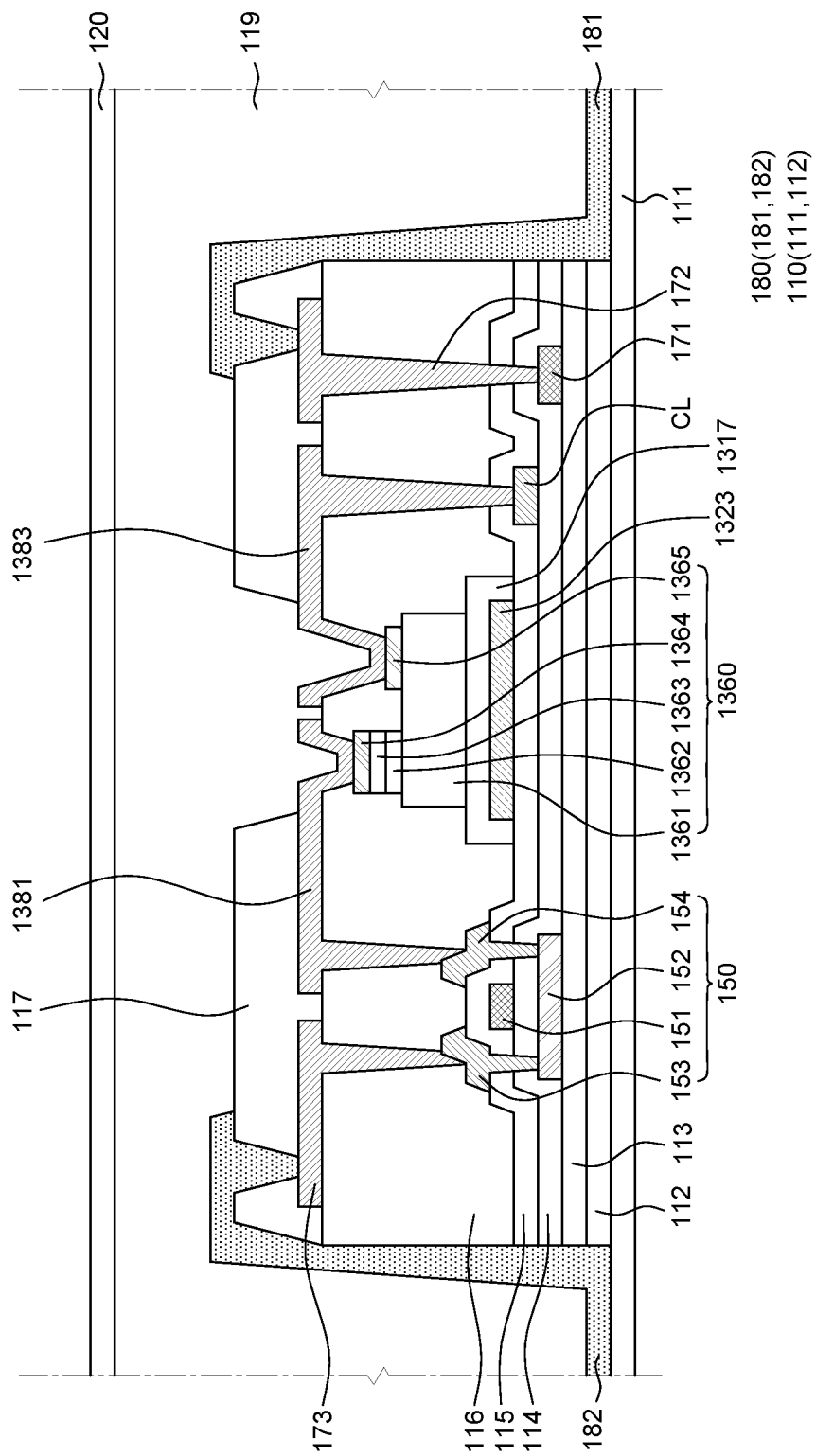
FIG. 13 is a cross-sectional view schematically showing a subpixel of a stretchable display device according to another embodiment of the present disclosure.

FIG. 13 is a cross-sectional view schematically showing a subpixel of a stretchable display device according to another embodiment of the present disclosure. The structure of one subpixel shown in FIG. 13 is substantially the same as the structure of the subpixel shown in FIG. 3 except for having a different light emitting element, so the components having the same reference numerals are not described.

Referring to FIG. 13, a common line CL is disposed on the gate insulating layer 114. The common line CL is a line applying a common voltage to a plurality of subpixels SPX. The common line CL may be made of the same material as the source electrode 153 and the drain electrode 154 of the transistor 150, but is not limited thereto. Further, the common line CL is disposed on a second substrate 112, thereby being able to play a role that makes the second substrate 112 not receive stretch stress when the stretchable display device is stretched. Accordingly, it is possible to suppress damage to micro LED 1360 disposed on the second substrate 112 when the stretchable display device is stretched.

A reflective layer 1323 is disposed on the inter-layer insulating layer 115. The reflective layer 1323 is a layer for discharging light, which emitted to the lower substrate 110 of light emitting from the micro LED 1360, to the outside by reflecting the light upward a stretchable display device. The reflective layer 1323 may be made of a metal material having high reflectance.

A first adhesive layer 1317 covering the reflective layer 1323 is disposed on the reflective layer 1323. The first adhesive layer 1317, which is a layer for bonding the micro LED 1360 on the reflective layer 1323, may insulate the reflective layer 1323 made of a metal material and the micro LED 1360. The first adhesive layer 1317 may be made of a thermosetting material or a photocuring material, but is not limited thereto. Although the first adhesive layer 1317 is shown as covering only the reflective layer 1323 in FIG. 13, the disposition position of the first adhesive layer 1317 is not limited thereto.

The micro LED 1360 is disposed on the first adhesive layer 1317. The micro LED 1360 is disposed while overlapping the reflective layer 1323. The micro LED 1360 includes an n-type layer 1361, an active layer 1362, a p-type layer 1363, a p-electrode 1364, and an n-electrode 1365. The micro LED 1360 is described as a micro LED 1360 of a lateral structure hereafter, but the structure of the micro LED 1360 is not limited thereto. For example, a micro LED 1360 may be disposed in a flip chip structure.

In detail, the n-type layer 1361 of the micro LED 1360 is disposed while overlapping the reflective layer 1323 on the first adhesive layer 1317. The n-type layer 1361 may be formed by injecting an n-type impurity into a gallium nitride having excellent crystallinity. The active layer 1362 is disposed on the n-type layer 1361. The active layer 1362, which is a light emitting layer that emits light in the micro LED 1360, may be made of a nitride semiconductor, for example, an indium gallium nitride. The p-type layer 1363 is disposed on the active layer 1362. The p-type layer 1363 may be formed by injecting a p-type impurity into a gallium nitride. However, the configuration materials of the n-type layer 1361, the active layer 1362, and the p-type layer 1363 are not limited thereto.

The p-electrode 1364 is disposed on the p-type layer 1363 of the micro LED 1360. The n-electrode 1365 is disposed on the n-type layer 1361 of the micro LED 1360. The n-electrode 1365 is spaced and disposed apart from the p-electrode 1364. In detail, the micro LED 1360 may be manufactured by sequentially stacking the n-type layer 1361, the active layer 1362, and the p-type layer 1363, etching a predetermined portion of the active layer 1362 and the p-type layer 1363, and then forming the n-electrode 1365 and the p-electrode 1364. At this time, the predetermined portion is a space for spacing the n-electrode 1365 and the p-electrode 1364 and the predetermined portion may be etched to expose a portion of the n-type layer 1361. In other words, the surface of the micro LED 1360 where the n-electrode 1365 and the p-electrode 1364 are disposed is not a planarized surface and may have different levels. Accordingly, the p-electrode 1364 is disposed on the p-type layer 1363, the n-electrode 1365 is disposed on the n-type layer 1361, and the p-electrode 1364 and the n-electrode 1365 are spaced and disposed apart from each other at different levels. Therefore, the n-electrode 1365 may be disposed adjacent to the reflective layer 1323 in comparison to the p-electrode 1364. The n-electrode 1365 and p-electrode 1364 may be made of a conductive material, for example, a transparent conductive oxide. Alternatively, the n-electrode 1365 and p-electrode 1364 may be made of the same material, but are not limited thereto.

A planarization layer 116 is disposed on the inter-layer insulating layer 115 and the first adhesive layer 1317. The planarization layer 116 is a layer that planarizes the top of the transistor 150. The planarization layer 116 may be disposed in an area excepting the area where the micro LED 1360 is disposed while planarizing the top of the planarization layer 116. The planarization layer 116 may be composed of two or more layers.

A first electrode 1381 and a second electrode 1383 are disposed on the planarization layer 116. The first electrode 1381 is an electrode that electrically connects the transistor 150 and the micro LED 1360. The first electrode 1381 is connected with the p-electrode 1364 of the micro LED 1360 through a contact hole formed at the planarization layer 116. Further, the first electrode 1381 is connected with the drain electrode 154 of the transistor 150 through contact holes formed at the planarization layer 116. However, the first electrode 1381 is not limited thereto and may be connected with the source electrode 153 of the transistor 150, depending on the type of the transistor 150. The p-electrode 1364 of the micro LED 1360 and the drain electrode 154 of the transistor 150 may be electrically connected by the first electrode 1381.

The second electrode 1383 is an electrode that electrically connects the micro LED 1360 and the common line CL. In detail, the second electrode 1383 is connected with the common line CL through contact holes formed at the planarization layer 116 and the inter-layer insulating layer 115 and is connected with the n-electrode 1365 of the micro LED 1360 through a contact hole formed at the planarization layer 116. Accordingly, the common line CL and the n-electrode 1365 of the micro LED 1360 are electrically connected.

When the stretchable display device is turned on, voltages having different levels may be supplied respectively to the drain electrode 154 of the transistor 150 and the common line CL. The voltage that is applied to the drain electrode 154 of the transistor 150 may be applied to the first electrode 1381 and a common voltage may be applied to the second electrode 1383. Voltages having different levels may be applied to the p-electrode 1364 and the n-electrode 1365 through the first electrode 1381 and the second electrode 1383, so the micro LED 1360 may emit light.

Although the transistor 150 is electrically connected with the p-electrode 1364 and the common line CL is electrically connected with the n-electrode 1365 in the description referring to FIG. 13, they are not limited thereto. That is, the transistor 150 may be electrically connected with the n-electrode 1365 and the common line CL may be electrically connected with the p-electrode 1364.

A bank 117 is disposed on the planarization layer 116, the first electrode 1381, the second electrode 1382, the data pad 173, and the connecting pad 172. The bank 117 is disposed to overlap an end of the reflective layer 1323 and a portion not overlapped with the bank 117 of the reflective layer 1323 may be defined as a light emitting area. The bank 117 may be made of an organic insulating material and may be made of the same material as the planarization layer 116. The bank 117 may be configured to include a black material to suppress a color mixing phenomenon due to light emitted from the micro LED 1360 and transmitted to an adjacent subpixel SPX.

As such, the light emitting elements of the stretchable display device according to an embodiment of the present disclosure may be organic light emitting elements, but may be micro LEDs 1360. Since the micro LED 1360 is made of not an organic material, but an inorganic material, reliability is excellent, so the lifespan is longer than that of a liquid crystal emitting element or an organic light emitting element. The micro LED 1360 has a quick turning speed, has small power consumption, has excellent stability because it has strong shock-resistance, and may display high-luminance images because it has excellent emission efficiency. Accordingly, the micro LED 1360 is an element that is suitable to be applied even to very large screens. In particular, since the micro LED 1360 is made of not an organic material, but an inorganic material, an encapsulation layer that is required when an organic light emitting element is used may not be used. Accordingly, the encapsulation layer that may be easily damaged, such as cracking, when the stretchable display device is stretched may be omitted. Accordingly, it is possible to omit use of an encapsulation layer that may be damaged when the stretchable display device according to another embodiment of the present disclosure is deformed such as bending or stretching, by using the micro LED 1360 as an emitting element in the stretchable display device. Further, since the micro LED 1360 is made of not an organic material, but an inorganic material, the emitting elements of the stretchable display device according to another embodiment of the present disclosure may be protected from water or oxygen and their reliability may be excellent.

What is claimed:

1. A stretchable display device comprising:
   a lower substrate including:
   a first substrate, and
   a plurality of second substrates on the first substrate, the plurality of second substrates having higher rigidity than a rigidity of the first substrate, the plurality of second substrates spaced apart from each other; and
   one or more light emitting elements disposed on each of the plurality of second substrates, and
   a plurality of insulating layers disposed below the one or more light emitting elements of a corresponding second substrate, the plurality of insulating layers spaced apart from each other.

2. The stretchable display device of claim 1, wherein an elastic modulus of the plurality of second substrates is higher than an elastic modulus of the first substrate.

3. The stretchable display device of claim 1, wherein the first substrate is made from at least one of polydimethylsiloxane (PDMS), or polyurethane (PU).

4. The stretchable display device of claim 1, wherein the plurality of second substrates is made from at least one of polyimide (PI), polyacrylate, or polyacetate.

5. The stretchable display device of claim 1, further comprising a first connecting line on the lower substrate, the first connecting line extending between a pair of second substrates arranged along a first direction.

6. The stretchable display device of claim 5, further comprising a second connecting line on the lower substrate, the second connecting line extending between another pair of second substrates arranged along a second direction intersecting the first direction.

7. The stretchable display device of claim 5, wherein the first connecting line is at least one of a gate line driven by a gate driving circuit, a data line driving by a data driving circuit, a high-potential power line, or a reference voltage line of the stretchable display device.

8. The stretchable display device of claim 5, wherein the first connecting line includes:
   a first part extending in the first direction; and
   a second part extending along a side surface of a second substrate that adjoins the first part.

9. The stretchable display device of claim 5, further comprising:
   a pad on a second substrate of the pair of second substrates;
   another pad on the remaining second substrate of the pair of second substrates, and
   wherein the first connecting line extends along a side surface of the second substrate to contact the pad, and extends along a side surface of the other second substrate to contact the another pad.

10. The stretchable display device of claim 5, wherein the first connecting line is made of a base polymer including conductive particles.

11. The stretchable display device of claim 1, further comprising one or more suppression patterns on the first substrate, the one or more suppression patterns disposed in spaces between the plurality of second substrates.

12. The stretchable display device of claim 11, wherein the one or more suppression patterns have higher rigidity than the rigidity of the first substrate.

13. The stretchable display device of claim 12, wherein a suppression pattern in the one or more suppression patterns includes a first rigid portion and a second rigid portion on the first rigid portion, the second portion having higher rigidity than a rigidity of the first rigid portion.

14. The stretchable display device of claim 11,
    wherein a size of each of the one or more suppression patterns is smaller than the size of each of the plurality of second substrates.

15. The stretchable display device of claim 11, further comprising:
    metal patterns disposed on the one or more suppression patterns.

16. The stretchable display device of claim 15,
    wherein the metal patterns are etch stoppers of the one or more suppression patterns.

17. The stretchable display device of claim 11,
    wherein the one or more suppression patterns are made of a material having a higher modulus than the first substrate.

18. The stretchable display device of claim 11,
    wherein a plurality of pixel areas including a rigid area where at least one of the second substrate is disposed and a flexible area surrounding the rigid area is defined on the first substrate, and
    the one or more suppression pattern is disposed in a boundary area of the pixel areas.

19. The stretchable display device of claim 18,
    wherein the one or more suppression patterns are disposed at corners of each of the plurality of pixel areas.

20. The stretchable display device of claim 1, further comprising one or more transistors on each of the plurality of second substrates.

21. The stretchable display device of claim 1, further comprising an additional insulating layer disposed on the one or more light emitting elements of a corresponding second substrate, wherein the additional insulating layer does not contact the first substrate.

* * * * *